i
US010673251B2

(12) United States Patent
Kaechi

(10) Patent No.: US 10,673,251 B2
(45) Date of Patent: Jun. 2, 2020

(54) ELECTRONIC APPARATUS AND CONTROL METHOD THEREOF

(71) Applicant: CANON KABUSHIKI KAISHA, Tokyo (JP)

(72) Inventor: Shuya Kaechi, Hashimoto (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 214 days.

(21) Appl. No.: 15/985,812

(22) Filed: May 22, 2018

(65) Prior Publication Data

US 2018/0351380 A1 Dec. 6, 2018

(30) Foreign Application Priority Data

May 30, 2017 (JP) .................. 2017-107064
May 30, 2017 (JP) .................. 2017-107065

(51) Int. Cl.
| | |
|---|---|
| *H02J 7/00* | (2006.01) |
| *G06F 1/26* | (2006.01) |
| *H01M 10/44* | (2006.01) |
| *H01M 10/48* | (2006.01) |
| *H02J 9/00* | (2006.01) |
| *G01R 31/36* | (2020.01) |
| *H02J 7/34* | (2006.01) |

(52) U.S. Cl.
CPC .............. *H02J 7/00* (2013.01); *G01R 31/36* (2013.01); *G06F 1/266* (2013.01); *H01M 10/44* (2013.01); *H01M 10/48* (2013.01); *H02J 7/342* (2020.01); *H02J 9/005* (2013.01); *H02J 2207/30* (2020.01)

(58) Field of Classification Search
CPC .. H02J 7/00; H02J 7/0029; H02J 7/342; H02J 2207/30; H02J 2207/40; H01M 10/44; H01M 10/48; G01R 31/36

USPC .................. 320/101, 107, 138, 155, 157
See application file for complete search history.

(56) References Cited

U.S. PATENT DOCUMENTS

| | | | |
|---|---|---|---|
| 2011/0062913 A1* | 3/2011 | Lin ................. | H02J 7/0029 320/101 |
| 2012/0242282 A1* | 9/2012 | Wada .............. | H02J 7/00 320/107 |
| 2017/0215255 A1* | 7/2017 | Kojima ........... | H02J 7/345 |

FOREIGN PATENT DOCUMENTS

JP        2012-205366 A        10/2012

* cited by examiner

*Primary Examiner* — Edward Tso
*Assistant Examiner* — Aaron Piggush
(74) *Attorney, Agent, or Firm* — Cowan, Liebowitz & Latman, P.C.

(57) ABSTRACT

An electronic apparatus that can receive power from an external apparatus connected via an interface and comprises an interface having a first terminal and a second terminal. The apparatus determines whether or not a time difference between a time of detection of a first voltage at a first terminal and a time of detection of a second voltage at a second terminal is smaller than or equal to a predetermined value, determines a type of the external apparatus by executing first connected device detection if the time difference is smaller than or equal to the predetermined value, and executing second connected device detection different from the first connected device detection if the time difference is larger than the predetermined value, and performs power reception control based on a result of determination of a type of the external apparatus.

13 Claims, 17 Drawing Sheets

FIG. 2

| CONNECTED DEVICE TYPE | CONTROL MODE | VOLTAGE AND CURRENT CONDITIONS |
|---|---|---|
| Non-Type-C | Non-Type-C POWER RECEPTION CONTROL MODE | 5V,~1.5A |
| Type-C | Type-C POWER RECEPTION CONTROL MODE | ~20V,~5A |
| Other | SUSPEND MODE | 5V,2.5mA |

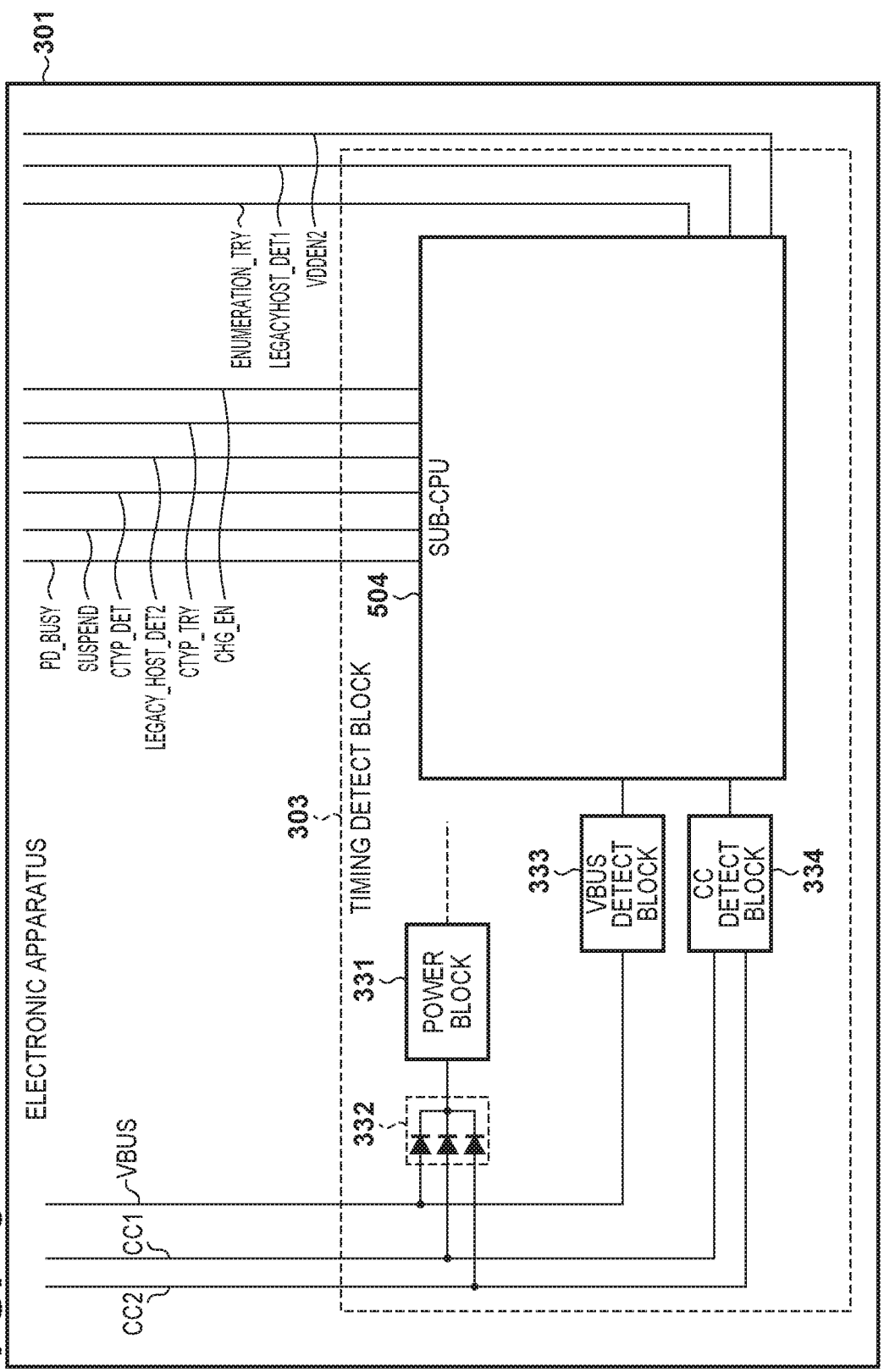

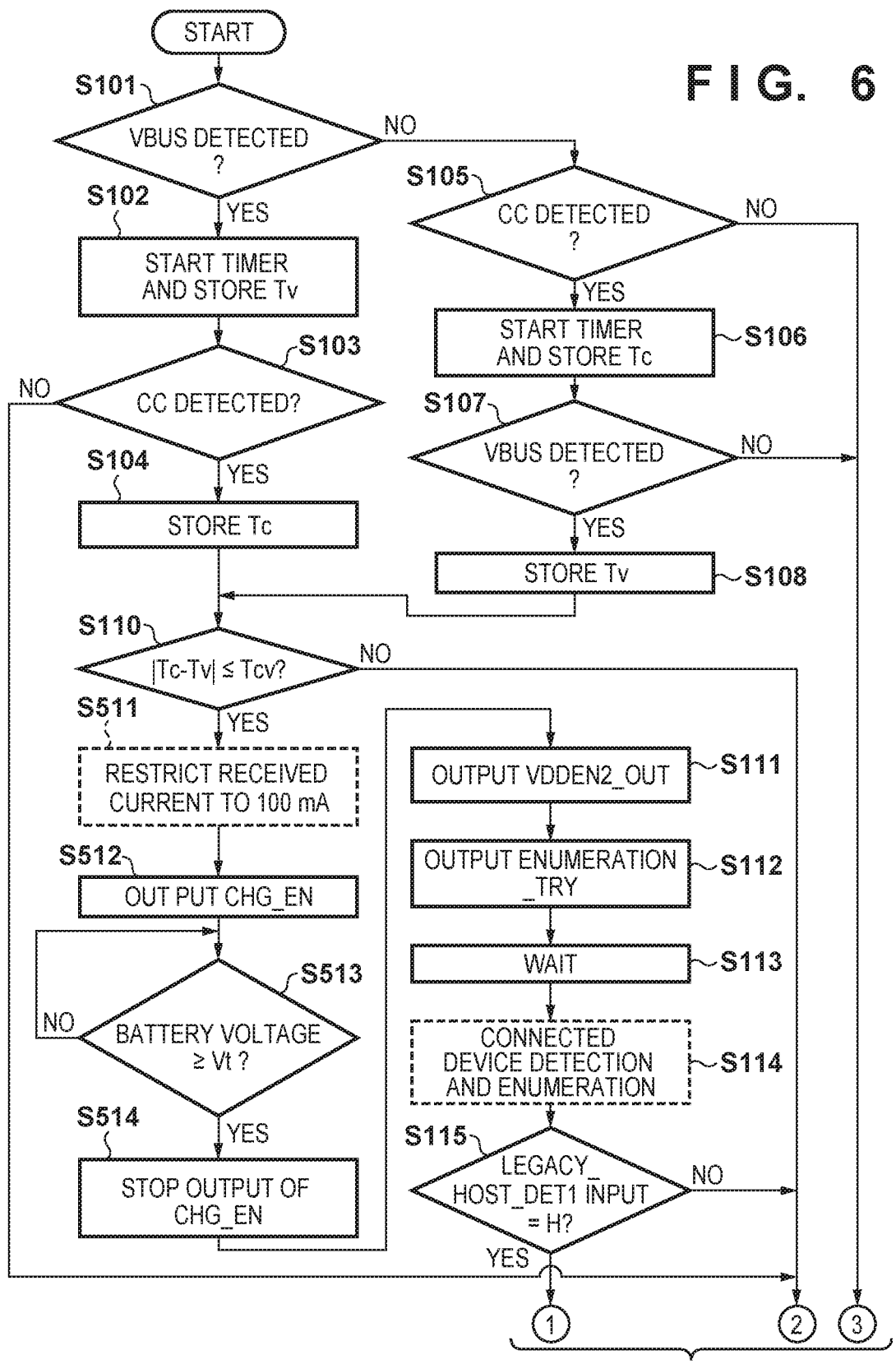

FIG. 8

| CONNECTED DEVICE TYPE | TIMING DETECTION RESULT | CONTROL MODE | VOLTAGE AND CURRENT CONDITIONS |
|---|---|---|---|
| Non-Type-C | VBUS to CC | Non-Type-C POWER RECEPTION CONTROL MODE | 5V, ~1.5A |
| Type-C | CC to VBUS | Type-C POWER RECEPTION CONTROL MODE | ~20V, ~5A |
| | CC to VBUS(Retry) | | |
| Other | No VBUS No CC Retry Count Max | SUSPEND MODE | 5V, 2.5mA |

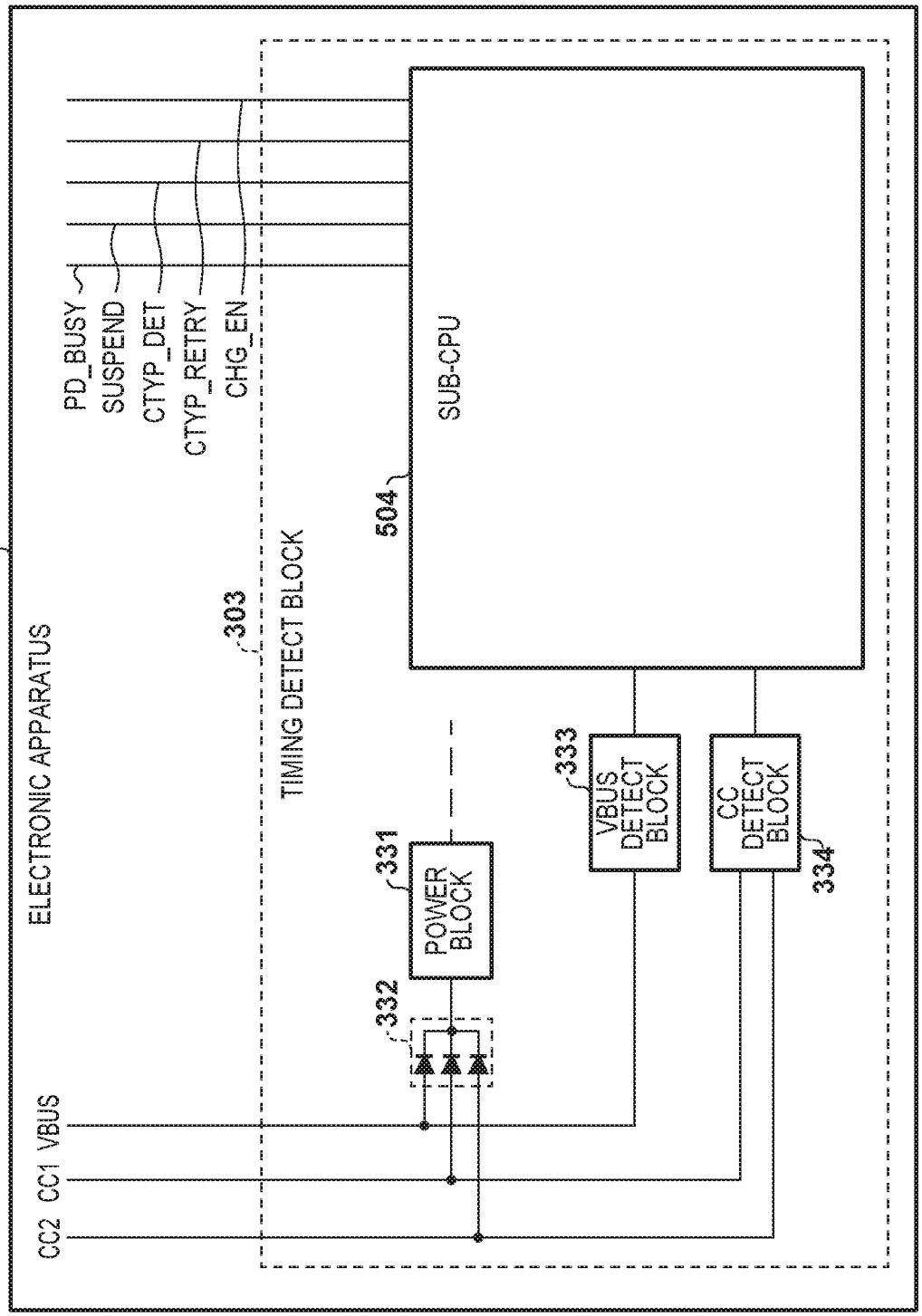

ELECTRONIC APPARATUS AND CONTROL METHOD THEREOF

BACKGROUND OF THE INVENTION

Field of the Invention

The present invention relates to an electronic apparatus that detects a connected device, and receives power from the connected device, and a control method thereof.

Description of the Related Art

In recent years, internal battery charge in which a secondary battery is changed within an electronic apparatus without being removed from the electronic apparatus has been generalized. In internal battery charge, methods for charging, using a USB (Universal Serial Bus) as an interface, the secondary battery within the electronic apparatus with power obtained from a VBUS line of a USB of a power supply apparatus have been in widespread use. In addition, due to USB PD (Power Delivery) and USB Type-C standards that were formulated in response to requests for further increasing power supply to electronic apparatuses, there has been a way to use power exceeding 7.5 W. Hereinafter, an apparatus having a USB that complies with a Type-C standard is referred to as a Type-C device, and an apparatus having a USB that does not comply with the Type-C standard is referred to as a non-Type-C device.

In general, electronic apparatuses determine the power supply capability of a power supply apparatus by performing connected device detection and enumeration, and obtain power from the power supply apparatus via a USB VBUS line in accordance with the determined supply capability. The electronic apparatuses determine the power supply capability of the power supply apparatus through connected device detection, and the determination is logically made using a voltage of a signal line of a USB interface as formulated in a standard, communication using a signal line, and/or communication using a VBUS line. Japanese Patent Laid-Open No. 2012-205366 describes an input/output circuit that detects the type of a charger by detecting voltages of a first data terminal and a second data terminal after being notified of power supply detection by a power source detection circuit.

In the USB Type-C standard, a power supply apparatus needs to supply a VBUS voltage within 275 ms after detecting connection to a power reception apparatus using a CC terminal. Therefore, the power reception apparatus can determine whether or not the power supply apparatus that is connected thereto is a Type-C device, according to whether or not a VBUS voltage has been detected within 275 ms after detecting a voltage of the CC terminal from the power supply apparatus. However, if a timing when the power supply apparatus outputs a VBUS voltage is too early, or the CC terminal is pulled up to the VBUS voltage by a resistor, a case is conceivable in which a timing for detecting the VBUS voltage that needs to be detected after a voltage of the CC terminal is detected is made early. A case is also conceivable in which a timing for detecting a VBUS voltage of the power supply apparatus that needs to be detected before a voltage of the CC terminal is detected is delayed due to a VBUS output capacitance and a VBUS input capacitance of the respective power supply apparatus and power reception apparatus. A case is also conceivable in which a USB interface cable is modified so as to not adapt to the above-described timing for detecting a VBUS voltage.

In the case where a voltage of the CC terminal is detected after a VBUS voltage is detected, the power reception apparatus determines that the power supply apparatus is a non-Type-C device. Even if the power supply apparatus is actually a Type-C device, there are cases where it is determined that the power supply apparatus is a non-Type-C device due to variation in the detection timing as described above. In that case, a power reception condition that is set in the power reception apparatus is restricted to the power of a USB2.0, for example, rather than the power supply capability of the Type-C device.

On the other hand, in the case where a VBUS voltage is detected after a voltage of the CC terminal is detected, the power reception apparatus determines that the power supply apparatus is a Type-C device. Even if the power supply apparatus is actually a non-Type-C device, and is an apparatus that adapts to USB2.0, there are cases where it is determined that the power supply apparatus is a Type-C device due to the above-described variation in detection timing. In that case, the power reception apparatus starts operating with a power supply capability that complies with the USB Type-C standard although the power supply apparatus is a non-Type-C.

SUMMARY OF THE INVENTION

One embodiment of the present invention provides an electronic apparatus that can appropriately determine the power supply capability of an external apparatus even if a terminal voltage detection timing when the external apparatus is connected is deviated, and a control method thereof.

According to one aspect of the present invention, there is provided an electronic apparatus that can receive power from an external apparatus connected via an interface, comprising: an interface having a first terminal and a second terminal; a determination unit configured to determine whether or not a time difference between a time of detection of a first voltage at a first terminal and a time of detection of a second voltage at a second terminal is smaller than or equal to a predetermined value; an execution unit configured to determine a type of the external apparatus by executing first connected device detection in a case where the time difference is smaller than or equal to the predetermined value, and executing second connected device detection different from the first connected device detection in a case where the time difference is larger than the predetermined value; and a control unit configured to perform power reception control based on a result of determination of a type of the external apparatus performed by the execution unit.

According to another aspect of the present invention, there is provided an electronic apparatus that determines a type of an external apparatus connected to an interface including a first terminal and a second terminal, the electronic apparatus comprising: a determination unit configured to determine a type of the external apparatus according to a second voltage at the second terminal having been detected within a time limit after a first voltage at the first terminal was detected; and a control unit configured to cause the determination unit to retry determination after a predetermined time has elapsed in a case where the second voltage at the second terminal could not be detected within the time limit after the second voltage at the first terminal was detected.

According to another aspect of the present invention, there is provided a control method of an electronic apparatus that can receive power from an external apparatus connected via an interface including a first terminal and a second terminal, the method comprising: determining whether or not a time difference between a time of detection a first voltages at the first terminal and a time of detection of a second voltage at the second terminal is smaller than or equal to a predetermined value; determining a type of the external apparatus by executing first connected device detection in a case where the time difference is smaller than or equal to the predetermined value, and executing second connected device detection different from the first connected device detection in a case where the time difference is larger than the predetermined value; and performing power reception control based on a result of determination of a type of the external apparatus.

According to another aspect of the present invention, there is provided a control method of an electronic apparatus that determines a type of an external apparatus connected to an interface including a first terminal and a second terminal, the method comprising: determining a type of the external apparatus according to a second voltage at the second terminal having been detected within a time limit after a first voltage at the first terminal was detected; and retrying the determining after a predetermined time has elapsed in a case where the second voltage at the second terminal could not be detected within the time limit after the first voltage at the first terminal was detected.

Further features of the present invention will become apparent from the following description of exemplary embodiments (with reference to the attached drawings).

BRIEF DESCRIPTION OF THE DRAWINGS

FIG. 2 shows a truth table of connected device types and operation conditions of the electronic apparatus according to the first embodiment.

FIG. 5 is a block diagram showing an exemplary configuration of an electronic apparatus according to a second embodiment.

FIG. 6 is a flowchart showing a connected device determination procedure that is performed by an electronic apparatus of a third embodiment.

FIG. 8 shows a truth table of a connected device types and operation conditions of the electronic apparatus in the fourth embodiment.

FIG. 11 is a block diagram showing an exemplary configuration of an electronic apparatus in a fifth embodiment.

DESCRIPTION OF THE EMBODIMENTS

Embodiments of the present invention will be described below with reference to the drawings. Note that the present invention is not limited to the following embodiments.

First Embodiment

In a first embodiment, in an electronic apparatus that can receive power from an external apparatus connected thereto via an interface, different connected device detections are executed based on timings of detecting a first voltage at a first terminal and detecting a second voltage at a second terminal of the interface. More specifically, by switching the connected device detections according to whether or not the time difference between the timings of detecting the first and second voltages at the first and second terminals is smaller than or equal to a predetermined value, a countermeasure against deviation in voltage detection timing can be taken. The first embodiment will be described below using an electronic apparatus that uses a USB as an interface, a VBUS terminal as a first terminal, and a CC terminal as a second terminal, as an example. The first voltage of the VBUS terminal and the second voltage of the CC terminal may be independent and different from each other. Furthermore, hereinafter, "detecting a voltage of the VBUS terminal" and "detecting a VBUS (terminal) voltage" mean "detecting the first voltage at the VBUS terminal". Also, "detecting a voltage of the CC terminal" and "detecting a CC (terminal) voltage" mean "detecting the second voltage at CC terminal".

Figure 3A:
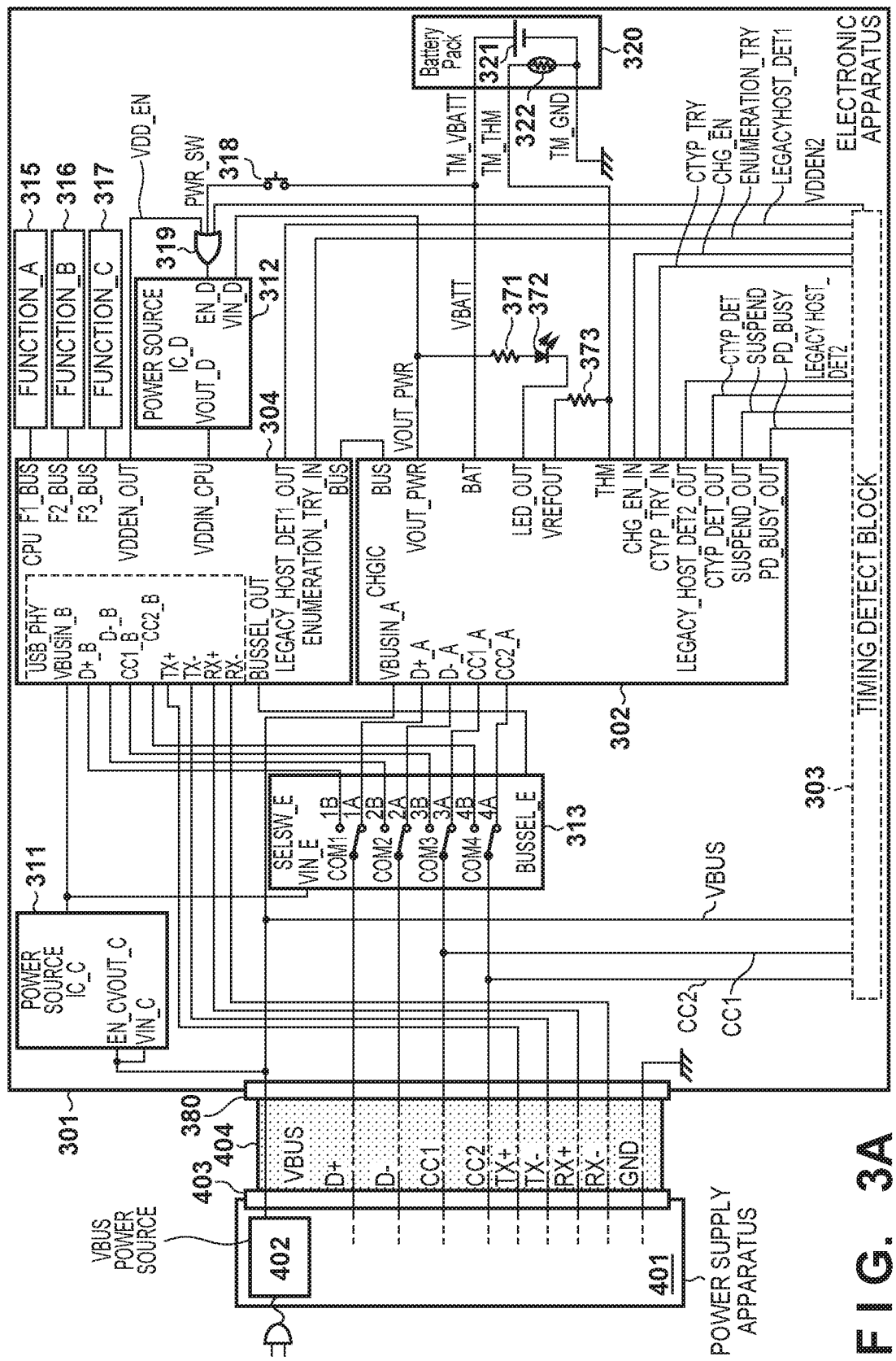
FIGS. 3A and 3B are block diagrams showing an exemplary configuration of the electronic apparatus according to the first embodiment.
Figure 3B:
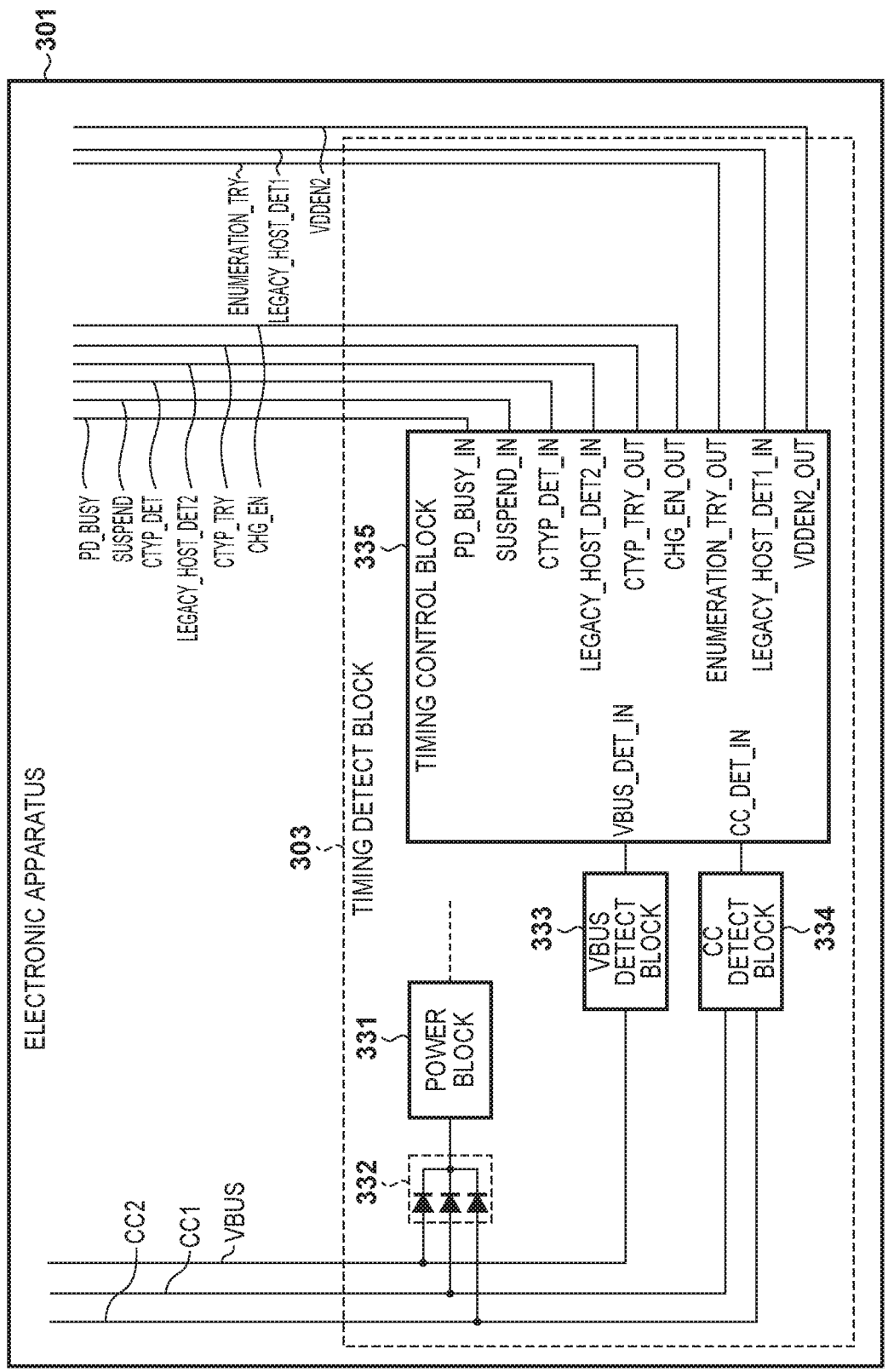

Before describing specific operations, first, the configuration of an electronic apparatus will be described. FIGS. 3A and 3B are block diagrams showing an exemplary configuration of the electronic apparatus according to the first embodiment. In the block diagrams that are used for describing the first embodiment, illustration of power source connection to blocks that are not required for describing the first embodiment and input and output capacitors of each block are omitted. Detailed description of blocks and operations that are not required for describing the first embodiment is also omitted.

In FIG. 3A, a power supply apparatus 401 as an external apparatus is an apparatus that can supply power to an electronic apparatus 301 by wire (a VBUS of a USB). The power supply apparatus 401 may be an apparatus that can only supply power, or may be an apparatus that has a function in addition to power supply. In addition, regarding a USB standard, a USB that complies with one of USB2.0, USB3.0, USB3.1, USB BC, USB PD, and USB Type-C may be used.

A VBUS power source 402 is a power source for supplying power from the power supply apparatus 401 to the electronic apparatus 301. As the power of the VBUS power source 402, power that is supplied from outside of the power supply apparatus 401 may be used, or power that is supplied from a battery provided inside the power supply apparatus 401 may be used. A USB connector 403 is a connector that complies with a USB standard. The USB connector 403 does not limit the apparatus configuration of the power supply apparatus 401, and thus the definition thereof is omitted. In addition, signals of a USB interface of the power supply apparatus 401 do not limit the apparatus configuration of the power supply apparatus 401, thus the definition thereof is omitted.

A USB interface cable 404 is a cable for engaging the USB interfaces of the power supply apparatus 401 and the electronic apparatus 301 with each other. The USB interface cable 404 may be an EMCA (Electronically Marked Cable Assembly).

The electronic apparatus 301 is an apparatus that can receive power by wire from the power supply apparatus 401 as the above-described external apparatus. A CPU 304 includes a processor that controls the electronic apparatus 301, a RAM (Random Access Memory) that is used as a work area, and a ROM (Read Only Memory) that stores processing procedures. A main function of the CPU 304 operates upon receiving voltage input VDDIN_CPU from outside. USB_PHY that is a USB function of the CPU 304 can operate upon receiving voltage input VBUS IN_B from outside, separately from the main function. The USB function of the CPU 304 can operate with lower power than when the main function is operating, and includes connected device detection and USB signal processing functions. Connected device detection is a function for detecting a standard which an external apparatus connected to the electronic apparatus 301 complies with, using logic detection and communication of VBUS, D+, D−, and CC signals. In connected device detection of this embodiment, the type of the power supply apparatus 401 is determined as one of USB2.0, USB3.0, USB3.1, USB BC, USB PD, and USB Type-C, for example.

The CPU 304 can perform enumeration processing of the power supply apparatus 401 connected to the electronic apparatus 301, using D+_B and D−_B signals. If enumeration processing was successful, the CPU 304 determines that the power supply apparatus 401 connected to the electronic apparatus 301 complies with one of USB2.0, USB3.0, and USB3.1. The CPU 304 has ENUMERATION_TRY_IN to which an ENUMERATION_TRY signal for instructing execution of connected device detection processing and enumeration processing of the power supply apparatus 401 using D+_B and D−_B signals is input. If the ENUMERATION_TRY signal is H, the CPU 304 executes connected device detection processing and enumeration processing of the power supply apparatus 401. If the ENUMERATION_TRY signal is L, the CPU 304 does not execute connected device detection processing and enumeration processing. Note that, in this specification, H indicates a logically High state, and L indicates a logically Low state.

In addition, the CPU 304 has LEGACY_HOST_DET1_OUT that outputs a LEGACY_HOST_DET1 signal indicating a state in which connected device detection processing and enumeration processing of the power supply apparatus 401 connected to the electronic apparatus 301 has been correctly performed. If connected device detection processing and enumeration processing of a partner apparatus connected to the electronic apparatus 301 has been correctly performed, the CPU 304 sets the LEGACY_HOST_DET1 signal to H. In addition, if connected device detection processing and enumeration processing have not been correctly performed, the CPU 304 sets the LEGACY_HOST_DET1 signal to L. When the CPU 304 sets the LEGACY_HOST_DET1 signal to H, the power supply apparatus 401 connected to the electronic apparatus 301 is a non-Type-C device (Legacy USB HOST).

A CHGIC 302 is a charging IC that performs charging control of a secondary battery cell 321 of a battery pack 320. Upon receiving voltage input VBUS IN_A from outside, the CHGIC 302 charges the battery pack 320. Also, in addition to such a charging function, the CHGIC 302 has a function for converting the voltage input VBUS IN_A into constant voltage output VOUT_PWR, and outputting the constant voltage output VOUT_PWR to a power source IC_D312. Furthermore, the CHGIC 302 has a function for, when there is no voltage input VBUS IN_A from outside, receiving an input of the battery pack 320, and outputting the voltage of the battery pack 320 as VOUT_PWR to another circuit, for example, the power source IC_D312. Furthermore, the CHGIC 302 has a connected device detection function similar to that of the CPU 304.

The CHGIC 302 has CTYP_DET_OUT for outputting a CTYP_DET signal indicating a state where connected device detection has been correctly performed, and CTYP_TRY_IN for receiving an input of a CTYP_TRY signal for instructing execution of connected device detection. It connected device detection has been correctly performed, the CHGIC 302 sets the CTYP_DET signal to H, and if no connected device was detected or connected device detection has not been correctly performed, sets the CTYP_DET signal to L. The CHGIC 302 executes connected device detection when the CTYP_TRY signal is H, and does not execute connected device detection when the CTYP_TRY signal is L.

In connected device detection, whether or not the power supply apparatus 401 is a non-Type-C device (Legacy USB HOST) is detected. The CHGIC 302 has LEGACY_HOST_DET2_OUT for outputting a LEGACY_HOST_DET2 signal indicating a result of performing connected device detection of the power supply apparatus 401 connected to the electronic apparatus 301. As a case where it is detected through connected device detection that an external apparatus is a non-Type-C device, a case of USB BC in which D+ and D−signals of the partner apparatus connected to the electronic apparatus 301 are short-circuited at a resistance value of 200Ω or less is conceivable, for example. The CHGIC 302 performs connected device detection of the power supply apparatus 401 connected to the electronic apparatus 301, and if it is determined that the power supply apparatus 401 is a non-Type-C device, sets the LEGACY_HOST_DET2 signal to H. If it is not determined that the power supply apparatus 401 is a non-Type-C device, the CHGIC 302 sets the LEGACY_HOST_DET2 signal to L.

In addition, the CHGIC 302 has CHG_EN_IN for receiving an input of a CHG_EN signal for performing control so as to enable charging. The CHGIC 302 further has SUSPEND_OUT that outputs a SUSPEND signal indicating a SUSPEND state, and PD_BUSY_OUT that outputs a PD_BUSY signal indicating that PD communication is being performed. If the CHG_EN signal is H, the CHGIC 302 can charge the battery pack 320, and if the CHG_EN signal is L, prohibits charging of the battery pack 320. In the case of SUSPEND state in which current input from the voltage input VBUS IN_A is restricted to 2.5 mA, which is a SUSPEND current, or lower, the CHGIC 302 sets the SUSPEND signal to H, and otherwise sets the SUSPEND signal to L. In the case where PD communication is being performed, the CHGIC 302 sets the PD_BUSY signal to H, and in the case where PD communication is not being performed, sets the PD_BUSY signal to L. Note that the CHGIC 302 is connected to the CPU 304 using a BUS. The CPU 304 can obtain the state of the CHGIC 302 via communication using the BUS, and can control the CHGIC 302.

The battery pack 320 can be removed from the electronic apparatus 301. The battery pack 320 has the lithium ion secondary battery cell 321 and a thermistor 322, for example. Output of the secondary battery cell 321 is indicated by VBATT. The thermistor 322 has a properly of an NTC (Negative Temperature Coefficient), for example. The battery pack 320 is engaged with the electronic apparatus 301 using three terminals, namely, a voltage output terminal TM_VBATT of the secondary battery cell 321, and a terminal TM_THM of the thermistor 322, and a ground terminal TM_GND. The thermistor terminal TM_THM is connected to a THM terminal of the CHGIC 302. In addition a PU resistor 373 is a resistor for pulling up the thermistor terminal TM_THM to a voltage output VREFOUT of the CHGIC 302.

A power source IC_C311 is a power source IC that converts voltage input VIN_C from outside into constant voltage output VOUT_C, and outputs the constant voltage output VOUT_C to the CPU 304. The power source IC_C311 controls ON/OFF of the output VOUT_C according to a control signal EN_C from outside. The power source IC_D312 is a power source IC that converts voltage input VIN_D from outside into constant voltage output VOUT_D, and outputs the constant voltage output VOUT_D to the CPU 304. The power source IC_D312 controls output ON/OFF of the output VOUT_D according to a control signal EN_D from outside.

SELSW_E313 is a selector switch for switching connection of a signal used for connected device detection between the CPU 304 and the CHGIC 302. SELSW_E313 can switch connection using a BUSSEL_IN signal. In the initial state of SELSW_E313, a signal used for connected device detection is connected on the CHGIC 302 side, and connected device detection is performed by the CHGIC 302. Note that connected device detection can also be performed by the CPU 304, and thus, a configuration may also be adopted in which, in the initial state of SELSW_E313, a signal used for connected device detection is connected on the CPU 304 side, and connected device detection is performed by the CPU 304.

A USB connector 380 is a connector that complies with the USB Type-C standard. From among signals of the USB interface of the electronic apparatus 301, signals that are not required for description according to the first embodiment are omitted. FUNCTION_A315 is an image capturing function unit of the electronic apparatus 301 constituted by an optical unit constituted by a lens and a driving system of the lens, an image sensor, an image capturing processing unit that converts a video captured by the image sensor into digital data, and the like. FUNCTION_B316 is an external apparatus storage function unit in which a flash memory card to/from which digital data can be written and read can be mounted, for example. FUNCTION_C317 is a display function unit constituted by an LCD (Liquid Crystal Display) that can display operation information of the electronic apparatus 301 and a video image, for example. Note that functions of FUNCTION_A315 to FUNCTION_317 are not limited to these, and there is no limitation to the three function units.

A button switch 318 is a power source switch for turning on the power source IC_D312 of the electronic apparatus 301 so as to operate the main function of the CPU 304 of the electronic apparatus 301. By pressing the button switch 318, a VBATT signal and a PWR_SW signal are electrically connected. Accordingly, by being pressed, the button switch 318 outputs the PWR_SW signal to another circuit. The PWR_SW signal, a VDDEN signal that is output from VDDEN_OUT of the CPU 304, a VDDEN2 signal from a timing detect block 303 are OR-connected by OR 319. Therefore, an input of one of the PWR_SW signal, the VDDEN signal, and the VDDEN2 signal enables the power source IC_D312 to be turned on.

An anode of an LED (Light Emitting Diode) 372 is connected to VOUT_PWR of the CHGIC 302 via a resistor 371, and a cathode of the LED 372 is connected to a LED_OUT terminal of the CHGIC 302. In the first embodiment, the LED_OUT terminal of the CHGIC 302 is an open collector or open drain output, and lighting-on and lighting-off of the LED 372 are controlled according to an output of an LED_OUT signal of the CHGIC 302. The LED 372 is used as a display for indicating a state of a charging operation of the electronic apparatus 301, and the LED 372 is in a light-on state while the CHGIC 302 is charging the secondary battery cell 321 of the battery pack 320, and the LED 372 is in a light-off state while the CHGIC 302 is not charging the secondary battery cell 321.

FIG. 3B shows the configuration of the timing detect block 303 of the electronic apparatus 301. The timing detect block 303 detects a VBUS terminal voltage and a CC terminal voltage of the USB interface, and performs a portion of control of connected device determination that is performed by the electronic apparatus 301, based on detection timings of those voltages.

A power block 331 receives an input of a voltage obtained by OR-connecting the VBUS terminal, a CC1 terminal, and a CC2 terminal of the USB connector 380 using a diode OR 332, and generates an operation voltage for the entirety of the timing detect block 303. In the case where there is an input of one of the VBUS terminal, the CC1 terminal and the CC2 terminal, the power block 331 can generate an operation voltage for the entirety of the timing detect block 303. A VBUS detect block 333 detects a voltage of the VBUS terminal from the USB connector 380, and transmits the detection result to a timing control block 335. Here, the fact that the voltage of the VBUS terminal is (normally) detected means that the VBUS detection unit 333 has detected that the voltage of the VBUS terminal has reached the predetermined voltage V1. The predetermined voltage is a voltage supplied by the VBUS terminal of the connected external device, and is assumed to be 5V, for example. A CC detect block 334 detects voltages of the CC1 terminal and/or the CC2 terminal of the USB connector 380, and transmits the detection result to the timing control block 335. Here, the fact that the voltages of the C1 terminal and/or the CC2 terminal are (normally) detected means that the CC detecting unit 333 detects that the voltage of at least one of the CC1 terminal and the CC2 terminal has reached a predetermined voltage. It is assumed that the predetermined voltage V2 is a voltage included in a voltage range indicating connection between devices defined by the USB 3.0 standard and the TSB Type-C standard. The VBUS detect block 333 and the CC detect block 334 are each constituted by a comparator, for example.

The timing control block 335 performs a portion of control of connected device determination that is performed by the electronic apparatus 301. The portion of control of connected device determination that is performed by the timing control block 335, a truth table and a control timing for controlling whether or not power can be received from the power supply apparatus 401 will be described later.

The timing control block 335 has CTYP_TRY_OUT that outputs the CTYP_TRY signal for instructing the CHGIC 302 to execute connected device detection. The timing control block 335 also has ENUMERATION_TRY_OUT that outputs the ENUMERATION_TRY signal for instructing the CPU 304 to execute connected device detection processing and enumeration processing. The timing control block 335 has LEGACY_HOST_DET1_IN for receiving an input of the LEGACY_HOST_DET1 signal indicating results of connected device detection processing and enumeration processing performed by the CPU 304. The timing control block 335 has LEGACY_HOST_DET2_IN for receiving an input of the LEGACY_HOST_DET2 signal indicating a result of connected device detection processing performed by the CHGIC 302. The timing control block 335 also has CTYP_DET_IN for receiving an input of the CTYP_DET signal indicating a state in which connected device detection has been correctly performed by the CHGIC 302.

Moreover, the timing control block 335 has PD_BUSY_IN for receiving an input of the PD_BUSY signal indicating that the CHGIC 302 is performing PD communication. When the CHGIC 302 is performing PD communication (when the PD_BUSY signal is H), the timing control block 335 performs exclusive control so as to not set the CHG_EN signal output to H. The timing control block 335 has VDDEN2_OUT that outputs the VDDEN2 signal for turning on the power source IC_D312. Accordingly, it becomes possible to turn on the CPU 304 by supplying a constant voltage output VOUT_D to the CPU 304 without pressing the button switch 318, for example. Here, the block diagrams of the electronic apparatus 301 shown in FIGS. 3A and 3B have been described.

Figure 1A:
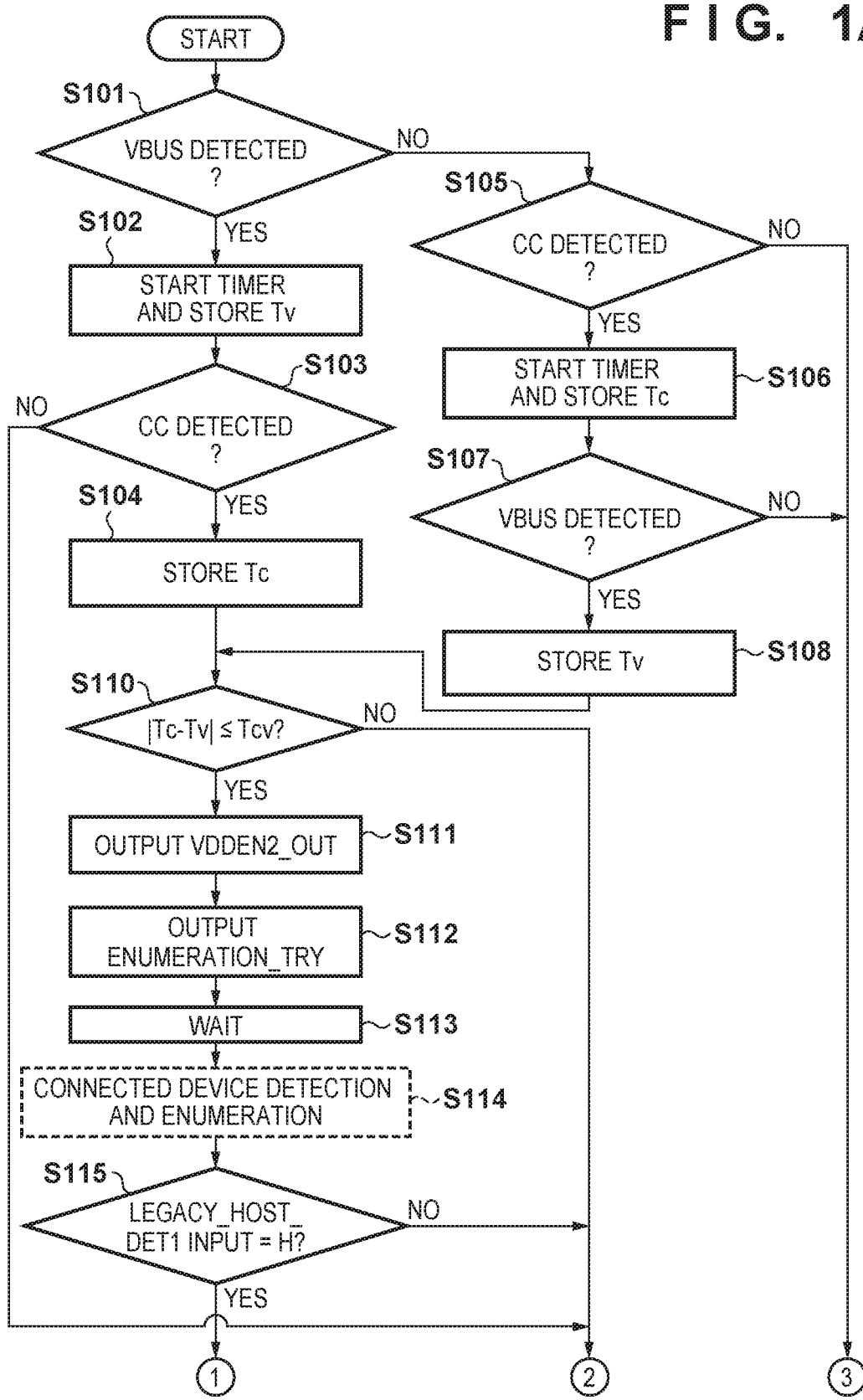
FIGS. 1A and 1B are flowcharts showing a connected device determination procedure that is performed by an electronic apparatus of a first embodiment.
Figure 1B:
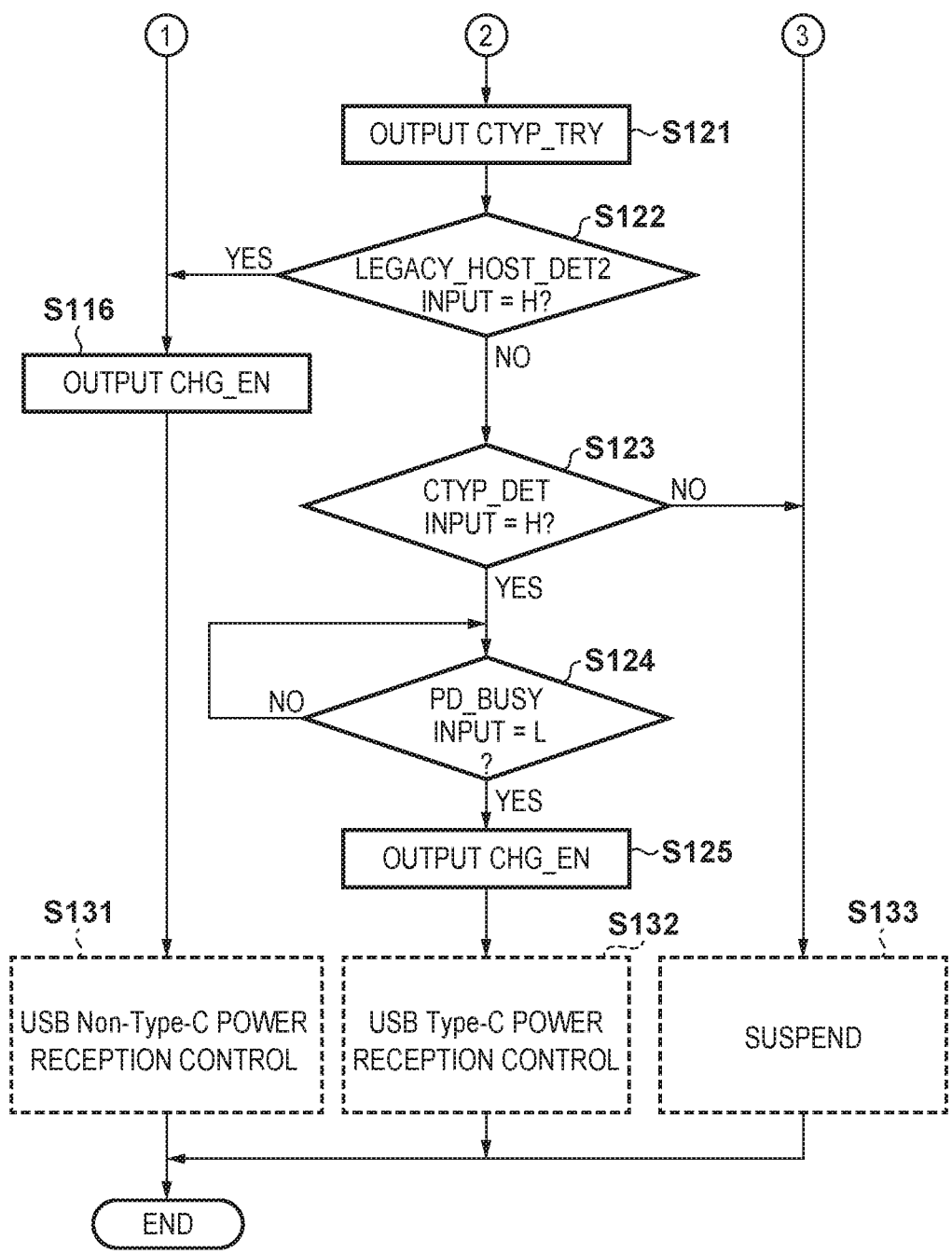

FIGS. 1A and 1B are flowcharts showing a procedure in which the electronic apparatus 301 according to the first embodiment performs connected device determination of the power supply apparatus 401 that is based on timings of detection of voltages of the VBUS terminal and the CC terminal of the USB interface, and determines a power reception control condition. Note that the processing shown in the flowchart in FIG. 1A and the processing shown in the flowchart in FIG. 1B are executed by the timing detect block 303. Note that processing indicated by lines in the flowcharts in FIGS. 1A and 1B is processing that is performed by blocks other than the timing detect block 303.

When the power supply apparatus 401 is connected to the USB connector 380 of the electronic apparatus 301 via the USB interface cable 404, the timing detect block 303 starts the processing shown in the flowcharts in FIGS. 1A and 1B.

In step S101, the timing control block 335 determines whether or not a voltage of the VBUS terminal of the USB connector 380 has been detected by the VBUS detect block 333. In other words, in step S101, the timing control block 335 determines whether or not the voltage at the VBUS terminal has reached a predetermined voltage (V1). If it is determined that the voltage of the VBUS terminal has been detected (YES in step S101), the timing control block 335 starts a timer in step S102 and stores a time Tv (the current time) when the voltage of the VBUS terminal was detected, in the RAM that serves as a work memory, for example.

Next, in step S103, the timing control block 335 determines whether or not the CC detect block 334 has detected a voltage of the CC1 terminal and/or a voltage of the CC2 terminal from the USB connector 380. In other words, in step S103, the timing control block 335 determines whether or not the voltage at the CC1 terminal and/or the CC2 terminal has reached a predetermined voltage (V2). This detection of a voltage at the CC terminal is executed over a predetermined period from the time Tv. If it is determined that a voltage of the CC terminal has been detected (YES in step S103), the timing control block 335 stores a time Tc when the voltage of the CC terminal was detected, for example, in the RAM that serves as a work memory, in step S104. As soon as it is determined in step S103 that the voltage of the CC terminal has been detected, the processing of step S104 is executed. If the voltage of the CC terminal has not been detected in step S103 even after a predetermined period has elapsed, processing from step S121 onward is executed. The processing from step S121 onward will be described later.

If it is determined in step S101 that the voltage of the VBUS terminal has not been detected, the timing control block 335 determines in step S105 whether or not the CC detect block 334 has detected the voltage of the CC1 terminal and/or the voltage of the CC2 terminal from the USB connector 380. In other words, in step S105, the timing control block 335 determines whether or not the voltage at the CC1 terminal and/or the CC2 terminal has reached a predetermined voltage (V2). In step S105, similar to step S103, determination of detection of a voltage at the CC terminal is executed over a predetermined period. If it is determined in step S105 that the voltage of the CC terminal has been detected, the timing control block 335 starts a timer, and stores the time Tc when the voltage of the CC terminal was detected, for example, in the RAM that serves as a work memory, in step S106.

If it is determined in step S105 that the voltage of the CC terminal has not been detected, the timing control block 335 ends the procedure. In this case, in step S133, the CHGIC 302 determines that the power supply apparatus 401 that is a connected device of the electronic apparatus 301 does not comply with any USB standard, and sets a SUSPEND state. In the case where the procedure advances to step S133 after steps S101 to S105, cases are conceivable such as where a VBUS terminal voltage is not sufficient, and the VBUS detect block 333 could not normally detect the voltage of the VBUS terminal. The SUSPEND state in step S133 is referred to as a SUSPEND mode.

In step S107, the timing control block 335 determines whether or not the VBUS detect block 333 has detected the voltage of the VBUS terminal from the USB connector 380. In other words, in step S107, the timing control block 335 determines whether or not the voltage at the VBUS terminal has reached a predetermined voltage (V1). If it is determined that the voltage of the VBUS terminal has been detected, the timing control block 335 stores the time Tv when the voltage of the VBUS terminal was detected, in step S108. Note that detection of a voltage at the VBUS terminal in step S107 is also performed over a predetermined period. If it is determined in step S107 that the voltage of the VBUS terminal has not been detected, the timing control block 335 ends the procedure. Also in this case, the CHGIC 302 sets power reception from the power supply apparatus 401 to a SUSPEND state in step S133. The predetermined periods during which detection is waited for in steps S103, S105, and S107 may be the same or may be different.

In step S110, the timing control block 335 determines whether or not the absolute value of the time difference between the time Tc when the voltage of the CC terminal was detected and the time Tv when the voltage of the VBUS terminal was detected is smaller than or equal to a predetermined value (in this embodiment, whether or not the absolute value is smaller than or equal to a threshold value Tcv). Here, the threshold value Tcv is a threshold value for determining the amount of advancement or delay of the time Tv when the voltage of the VBUS terminal was detected with reference to the tip Tc when the voltage of the CC terminal was detected.

If the absolute value of the time difference between the time Tc when the voltage of the CC terminal was detected and the time Tv when the voltage of the VBUS terminal was detected is smaller than or equal to the threshold value Tcv, it is conceivable that the VBUS detection timing is not accurate due to factors (1) to (3) listed below.

(1) The power supply apparatus 401 is a Type-C device, but a VBUS voltage output timing is too early.

(2) The power supply apparatus 401 is a Type-C device, but the CC terminal of the USB Type-C cable is pulled up to a VBUS voltage by a resistor, and the timing of detection of the VBUS voltage performed by the electronic apparatus 301 becomes earlier.

(3) The power supply apparatus 401 is a non-Type-C device, but, due to the VBUS output capacitance and VBUS input capacitance of the respective power supply apparatus 401 and electronic apparatus 301, a timing of detection of a VBUS voltage that needs to be detected before detection of the voltage of the CC terminal is delayed.

Note that the threshold value icy is any value, and is determined as follows. For example, regarding the above-described factor (3), assume that the VBUS output capacitance of the power supply apparatus 401 is 150 µF, the VBUS input capacitance of the electronic apparatus 301 is 10 µF, and an impedance of a system from the USB connector 403 to the USB connector 380 is 1Ω. In the case of the above assumption, the threshold value Tcv for the time difference is set to 5 ms in consideration of a time period during which electric charges are accumulated in the VBUS output capacitance and the VBUS input capacitance of the power supply apparatus 401 and an UFP apparatus, the accuracy of the timer, and the like, for example.

If the time difference between the time Tc and the time Tv is smaller than or equal to Tcv, the reliability of connected device detection that is based on detection timings of voltages of the CC terminal and the VBUS terminal is low due to the above three factors. In view of this, if it is determined that the absolute value of the time difference between the time Tc and the time Tv is smaller than or equal to the threshold value Tcv (YES in step S110), connected device detection and enumeration processing (first connected device detection) are performed in the processing from step S111 onward. On the other hand, if it is determined that the absolute value of the time difference between the time Tc and the time Tv is larger than a predetermined value (not smaller than or equal to the threshold value Tcv) (No in step S110), second connected device detection is performed in processing from step S121 onward. In second connected device detection, connected device detection is performed in which timings of detection of voltages of the VBUS terminal and the CC terminal (before/after relationship) are taken into consideration.

In step S111, the timing control block 335 changes, to H, the VDDEN2 signal that is output from VDDEN2_OUT, turns on the power source IC_D312, and starts the CPU 304. Subsequently, in step S112, the timing control block 335 changes, to H, the ENUMERATION_TRY signal that is output from ENUMERATION_TRY_OUT. The CPU 304 switches a destination of connection of the signal by SELSW_E313 to the CPU 304 side according to the ENUMERATION_TRY signal having changed to and executes enumeration processing. In step S113, the timing control block 335 waits for a period required for connected device detection processing and enumeration processing that are performed by the CPU 304 to end.

In step S114, the CPU 304 performs connected device detection processing and enumeration processing of the power supply apparatus 401 connected to the electronic apparatus 301, and outputs the processing result to the LEGACY_HOST_DET1 signal. In enumeration processing, the CPU 304 sets MaxPower declaration of the configuration descriptor to 500 mA, for example. In the case where connected device detection and enumeration processing have ended normally, the CPU 304 changes the LEGACY_HOST_DET1 signal to H. Note that the MaxPower declaration of the configuration descriptor in enumeration processing in step S114 is not limited to 500 mA, and may be 900 mA or the like. MaxPower declaration of the configuration descriptor can be set to any value within the range of the USB standard.

In step S115, the timing control block 335 determines whether or not the power supply apparatus 401 connected to the electronic apparatus 301 is a non-Type-C device (Legacy USB HOST). If the LEGACY_HOST_DET1 signal that is input to LEGACY_HOST_DET1_IN is H, the timing control block 335 determines that the power supply apparatus 401 connected to the electronic apparatus 301 is a non-Type-C device. Subsequently, in step S116, the timing control block 335 changes, to H, the CHG_EN signal that is output from CHG_EN_OUT, and permits the CHGIC 302 to perform a charging operation. Note that the CHG_EN signal is a signal for enabling a function of the CHGIC 302 charging the battery pack 320. In step S131, the CHGIC 302 starts power reception control under a power reception condition that complies with the non-Type-C standard. For example, a current that is received from the power supply apparatus 401 is restricted to a current value declared in the configuration descriptor in the above enumeration processing, or lower. The processing of flowcharts in FIGS. 1A and 1B are then ended.

A case where the LEGACY_HOST_DET1 signal is L in step S115 (NO in step S115) is a case where it cannot be determined that the power supply apparatus 401 connected to the electronic apparatus 301 is a non-Type-C device, and the processing from step S121 onward is executed. Note that, in the case where step S122 is executed as a result of the determination processing in step S115, the CPU 304 switches SELSW_E313 to the CHGIC 302 side.

In step S121, the timing control block 335 outputs H to the CTYP_TRY signal, and the procedure advances to step S122. The CTYP_TRY signal is a signal for causing the CHGIC 302 to execute connected device detection. Therefore, the CHGIC 302 executes connected device detection according to the CTYP_TRY signal. In step S122, the timing control block 335 determines whether or not the power supply apparatus 401 connected to the electronic apparatus 301 is a non-Type-C device. The timing control block 335 determines that the power supply apparatus 401 is non-Type-C device in the case where the LEGACY_HOST signal that is input to LEGACY_HOST_DET2_IN is H. If it is determined in step S122 that the power supply apparatus 401 is a non-Type-C device, the above-described processing from step S116 onward is executed.

If it is determined in step S122 that an input of the LEGACY_HOST_DET2 signal is L, it is determined that the power supply apparatus 401 is not a non-Type-C device. In this case, in step S123, the timing control block 335 determines whether the CTYP_DET signal that is input from the CHGIC 302 to CTYP_DET_IN is or L. The CTYP_DET signal is a signal that changes to H in the case where the type of a partner apparatus connected to the electronic apparatus 301 has been correctly detected by the connected device detection function of the CHGIC 302. If it is determined in step S123 that the CTYP_DET signal is H, the timing control block 335 determines that connected device detection by the CHGIC 302 could be correctly performed, and if the CTYP_DET signal is L, determines that connected device detection by the CHGIC 302 could not be correctly performed.

If it is determined in step S123 that connected device detection could not be correctly performed, the CHGIC 302 sets the power reception condition to a SUSPEND state in step S133. The processing in step S133 has been described above, and a description thereof is omitted. In FIG. 1B, the procedure advancing to step S133 after step S123 indicates that the partner apparatus connected to the electronic apparatus 301 does not comply with any USB standard, and thus the connected device type is called Other.

If it is determined in step S123 that connected device detection has been correctly performed, the timing control block 335 determines in step S124 whether or not the PD_BUSY signal input indicating that PD communication is being performed is L. The timing control block 335 waits for the PD_BUSY signal to change to L (step S124), and when the PD_BUSY signal changes to L, outputs H to the CHG_EN signal in step S125. The CHG_EN signal is a signal for enabling the function of the CHGIC 302 charging the battery pack 320. In step S132, the CHGIC 302 determines that the power supply apparatus 401 is a Type-C device, and starts power reception control at power that complies with the Type-C standard. The processing shown as the flowcharts in FIGS. 1A and 1B is then ended.

As described above, in the case where the difference between the time (Tc) when the voltage of the CC terminal was detected and the time (Tv) when the voltage of the VBUS terminal was detected is smaller than or equal to Tvc (e.g., 5 ms), the CPU 304 performs connected device detection processing and enumeration processing of the partner apparatus that is connected. In the case where it could be determined that the partner apparatus is a non-Type-C device through the connected device detection processing and enumeration processing, the electronic apparatus 301 starts power reception control at power that complies with the non-Type-C standard (step S131). In the case where it could not be determined that the partner apparatus is a non-Type-C device through connected device detection processing and enumeration processing, connected device detection processing of the partner apparatus is performed through the connected device detection function of the CHGIC 302. If it could be determined, through the connected device detection function of the CHGIC 302, that the partner apparatus is a Type-C device, the electronic apparatus 301 starts power reception control at power that complies with the Type-C standard (step S132).

Note that, in the first embodiment, a power reception control mode that is started in step S131 at power that complies with the USB non-Type-C standard is referred to as a non-USB Type-C power reception control mode. Also, the non-USB Type-C standard refers to one standard out of USB2.0, USB3.0, USB3.1, and USB BC. In addition, in the first embodiment, the power reception control mode that is started in step S132 at power that complies with the USB Type-C standard is referred to as a USB Type-C power reception control mode. Note that the USB Type-C standard is one standard out of a 1.5 A current mode of USB Type-C, a 3.0 A current mode of USB Type-C, and USB Type-C of a USB PD mode by communication of the CC terminal of the USB Type-C.

FIG. 2 shows a truth table of type, power reception control mode, voltage and current conditions as a result of connected device detection performed by the electronic apparatus 301 in the case of operating in accordance with the flowcharts in FIGS. 1A and 1B. In the truth table in FIG. 2, a connected device type being non-Type-C corresponds to a result in a case where it is determined in step S115 or S122 in the flowchart in FIG. 1A or 1B that a partner apparatus connected to the electronic apparatus 301 is a non-Type-C device. In the case where a connected device type is a non-Type-C device, the power supply apparatus 401 complies with one of USB2.0, USB3.0, USB3.1, and USB BC standards, and thus a non-Type-C power reception control mode suitable for one standard is set. Voltage and current conditions are 5V and 1.5 A or lower.

In the truth table in FIG. 2, a connected device type being Type-C corresponds to a result in the case where the procedure advanced to step S124 after steps S122 and S123 of the flowcharts in FIGS. 1A and 1B. If a connected device type is Type-C, the power supply apparatus 401 is a Type-C device, and thus a Type-C power reception control mode suitable for the Type-C standard is set. Voltage and current conditions are 20 V or lower and 5 A or lower.

In the truth table in FIG. 2, a connected device type being Other corresponds to a result in the case where the VBUS terminal voltage and the CC terminal voltage were not detected in steps S101, S105, and S107 in the flowcharts in FIGS. 1A and 1B. In addition, a connected device type being Other includes a case where it is determined in step S123 that connected device detection could not be correctly performed. If a connected device type is Other, the power supply apparatus 401 does not comply with any USB standard, and thus a SUSPEND mode is set. Voltage and current conditions are 5V and 2.5 mA or lower.

FIGS. 4A to 4E are timing charts showing an example of determination of power supply capability of the power supply apparatus 401 and a signal control procedure for starting a power reception operation under a power condition that is based on the determination.

Figure 4A:
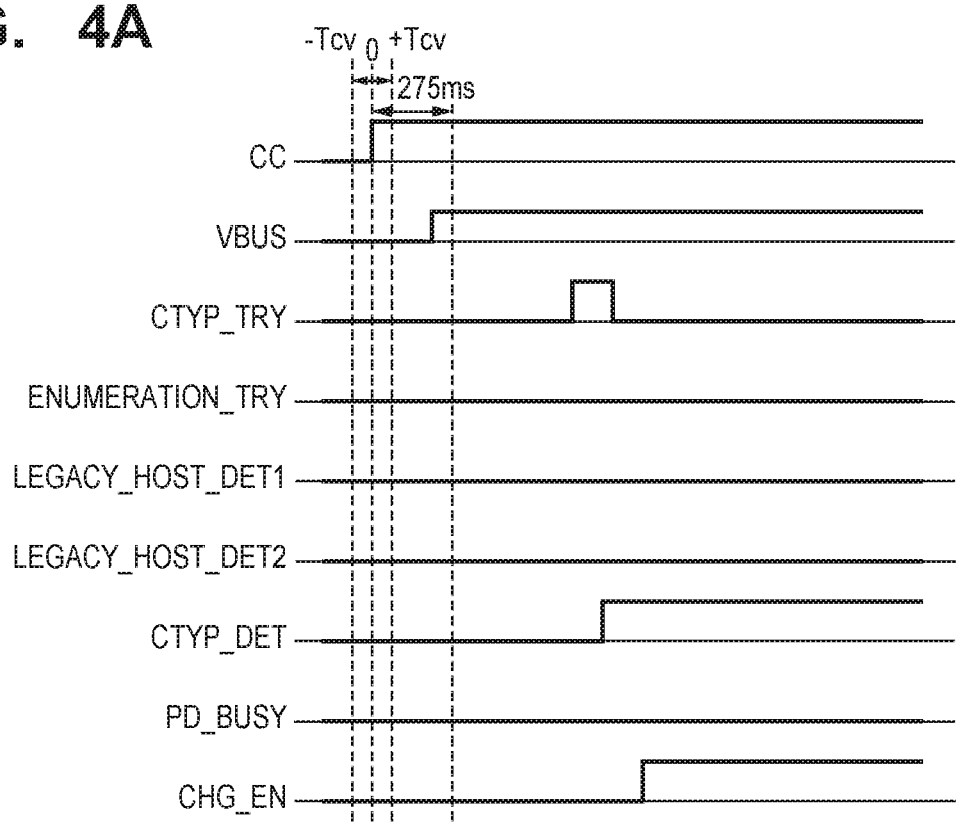
FIGS. 4A to 4E are timing charts showing signal operations in the electronic apparatus of the first embodiment.

FIG. 4A is a timing chart in the case where the power supply apparatus 401 is a Type-C device, and the voltage of the VBUS terminal was detected after a time Tcv or more elapsed after the voltage of the CC terminal was detected. The timing control block 335 sets the CTYP_TRY signal to H (NO in step S110, and the procedure advances to step S121). When the CTYP_TRY signal changes to H, the CHGIC 302 performs connected device detection of the power supply apparatus 401. The power supply apparatus 401 is Type-C, in other words, it is not possible to determine that the power supply apparatus 401 is non-Type-C, and thus the CHGIC 302 sets the LEGACY_HOST_DET2 signal to L. In this example, the voltage of the VBUS terminal was detected within 275 ms after the voltage of the CC terminal was detected, indicating that the CHGIC 302 could correctly perform connected device detection, and the CHGIC 302 outputs H to the CTYP_DET signal. The LEGACY_HOST_DET2 signal is L, the CTYP_DET signal is H, and the PD_BUSY signal is L, and thus the timing control block 335 outputs H to the CHG_EN signal (NO in step S122, YES in step S123, YES in step S124, and the procedure advances to step S125). The CHGIC 302 starts power reception based on the Type-C standard according to the CHG_EN signal having changed to H.

Figure 4B:
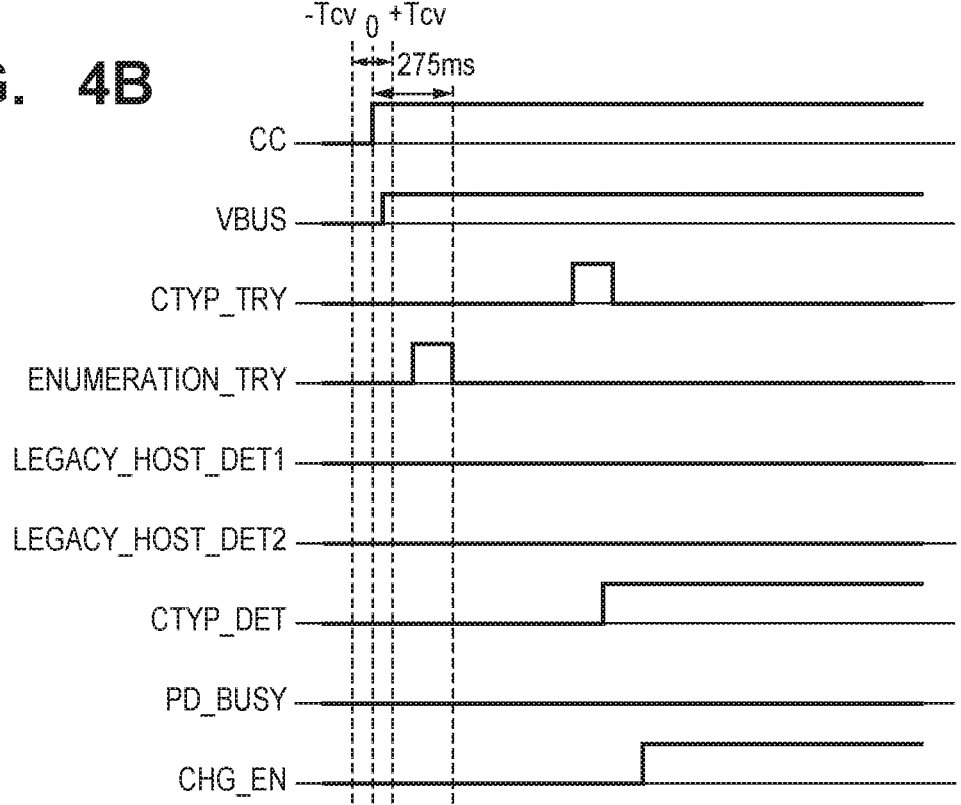

FIG. 4B is a timing chart in the case where the power supply apparatus 401 is a USB Type-C device, and the voltage of the VBUS terminal was detected within the time Tcv after the voltage of the CC terminal was detected. The timing control block 335 outputs H to the ENUMERATION_TRY signal, and waits for a predetermined period until connected device detection processing and enumeration processing of the power supply apparatus 401 that are performed by the CPU 304 end (YES in step S110, and the procedure advances to steps S111 to S113). The CPU 304 performs connected device detection processing and enumeration processing of the power supply apparatus 401 according to the ENUMERATION_TRY signal being H (step S114).

Since the power supply apparatus 401 is a Type-C device, the CPU 304 outputs L to the LEGACY_HOST_DET1 signal. Since the LEGACY_HOST_DET1 signal is L, and thus the timing control block 335 outputs H to the CTYP_TRY signal (NO in step S115, and the procedure advances to step S121). The CHGIC 302 performs connected device detection of the power supply apparatus 401 connected to the electronic apparatus 301, according to the CTYP_TRY signal being H. Since the power supply apparatus 401 is a Type-C device, the CHGIC 302 outputs L to the LEGACY_HOST_DET2 signal. The voltage of the VBUS terminal was detected after the voltage of the CC terminal was detected, indicating connected device detection could be correctly performed, and thus the CHGIC 302 outputs H to the CTYP_DET signal. Since the LEGACY_HOST_DET2 signal is L, the CTYP_DET signal is H, and the PD_BUSY signal is L, the timing control block 335 outputs H to the CHG_EN signal (NO in step S122, YES in step S123, YES in step S124, and the procedure advances to step S125). The CHGIC 302 starts power reception based on the Type-C standard according to the CHG_EN signal having changed to H.

Figure 4C:
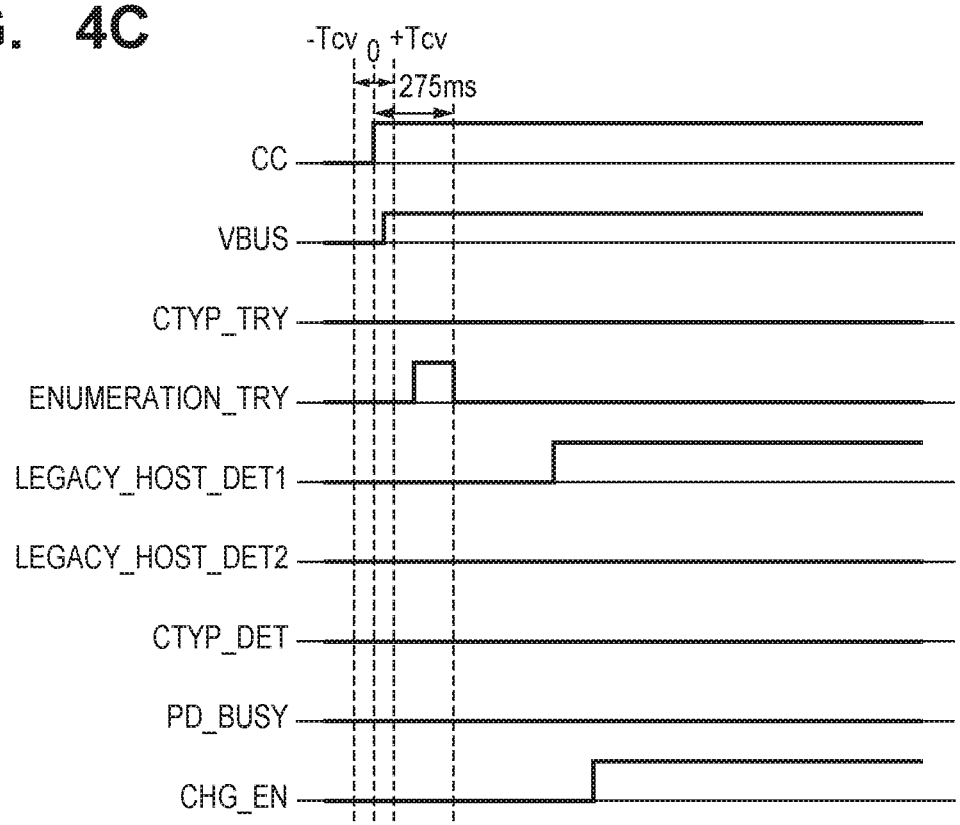

FIG. 4C is a timing chart in the case where the power supply apparatus 401 is a non-Type-C device, and the VBUS terminal voltage was detected within the time Tcv after the CC terminal voltage was detected. The timing control block 335 outputs H to the ENUMERATION_TRY signal, and waits for a period until connected device detection processing and enumeration processing of the power supply apparatus 401 that is performed by the CPU 304 ends (YES in step S110, and the procedure advances to steps S111 to S113). The CPU 304 performs connected device detection processing and enumeration processing of the power supply apparatus 401 according to the ENUMERATION_TRY signal being H (step S114).

Since the power supply apparatus 401 is a non-Type-C device, the CPU 304 outputs H to the LEGACY_HOST_DET1 signal. Since the LEGACY_HOST_DET1 signal is H, the timing control block 335 does not set the CTYP_TRY signal to H, and sets the CHG_EN signal to H (YES in step S115, and the procedure advances to step S116). The CHGIC 302 starts power reception under a power reception condition of a non-Type-C device. In this manner, despite that the voltage of the VBUS terminal was detected after the voltage of the CC terminal was detected, the CHGIC 302 can correctly recognize that the power supply apparatus 401 that is connected is a non-Type-C device.

Figure 4D:
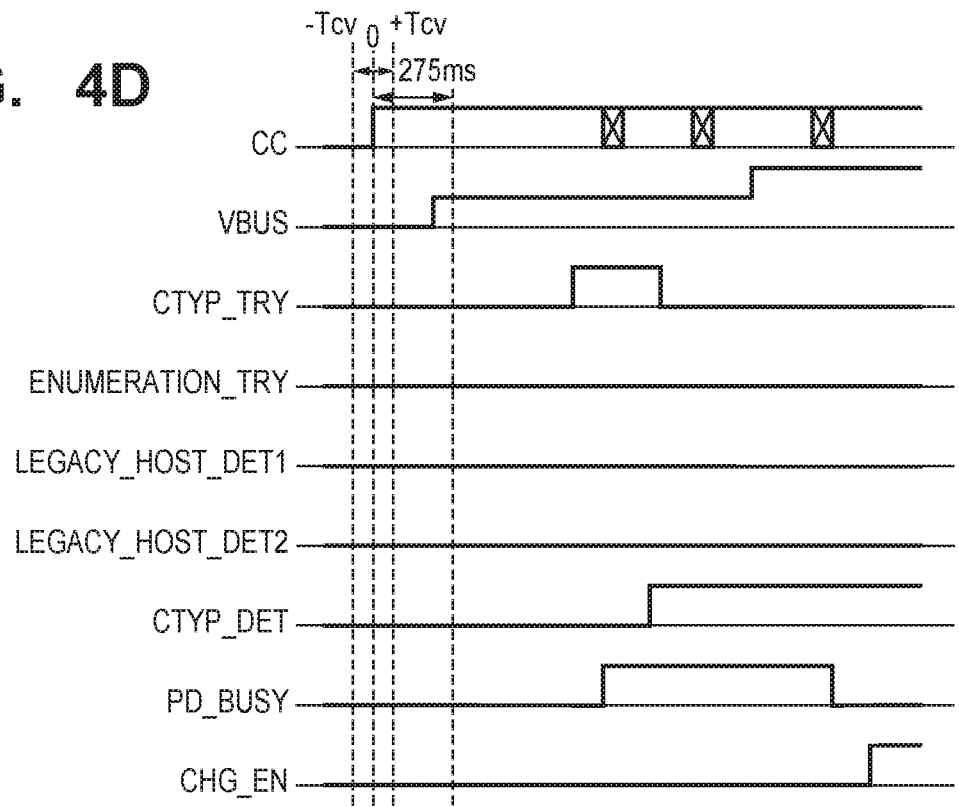

Similar to FIG. 4A, FIG. 4D is a timing chart in the case where the power supply apparatus 401 is a Type-C device, and the voltage of the VBUS terminal was detected after the time Tcv or more has elapsed after the voltage of the CC terminal was detected. FIG. 4D further shows a case where USB PD communication using the CC terminal is performed between the electronic apparatus 301 and the power supply apparatus 401, and a VBUS terminal voltage is changed.

The timing control block 335 outputs H to the CTYP_TRY signal (NO in step S110, and the procedure advances to step S121). The CHGIC 302 performs connected device detection of the power supply apparatus 401 connected to the electronic apparatus 301 according to the CTYP_TRY signal having changed to H. Since the power supply apparatus 401 is a Type-C device, the CHGIC 302 outputs L to the LEGACY_HOST_DET2 signal. The CHGIC 302 performs USB PD communication using the CC terminal with the power supply apparatus 401 connected to the electronic apparatus 301. During USB PD communication, the PD_BUSY signal is H. Connected device detection and USB PD communication could be correctly performed, and thus the CHGIC 302 outputs H to the CTYP_DET signal.

The CHGIC 302 performs USB PD communication using the CC terminal with the power supply apparatus 401, and after the VBUS terminal voltage is changed, the CHGIC 302 continuously performs USB PD communication using the CC terminal with the power supply apparatus 401. When USB PD communication ends, the PD_BUSY signal changes to L. When the CTYP_DET signal changes to H and the PD_BUSY signal changes to L, the timing control block 335 sets the CHG_EN signal to H (YES in step S123, YES in step S124, and the procedure advances to step S125).

Figure 4E:
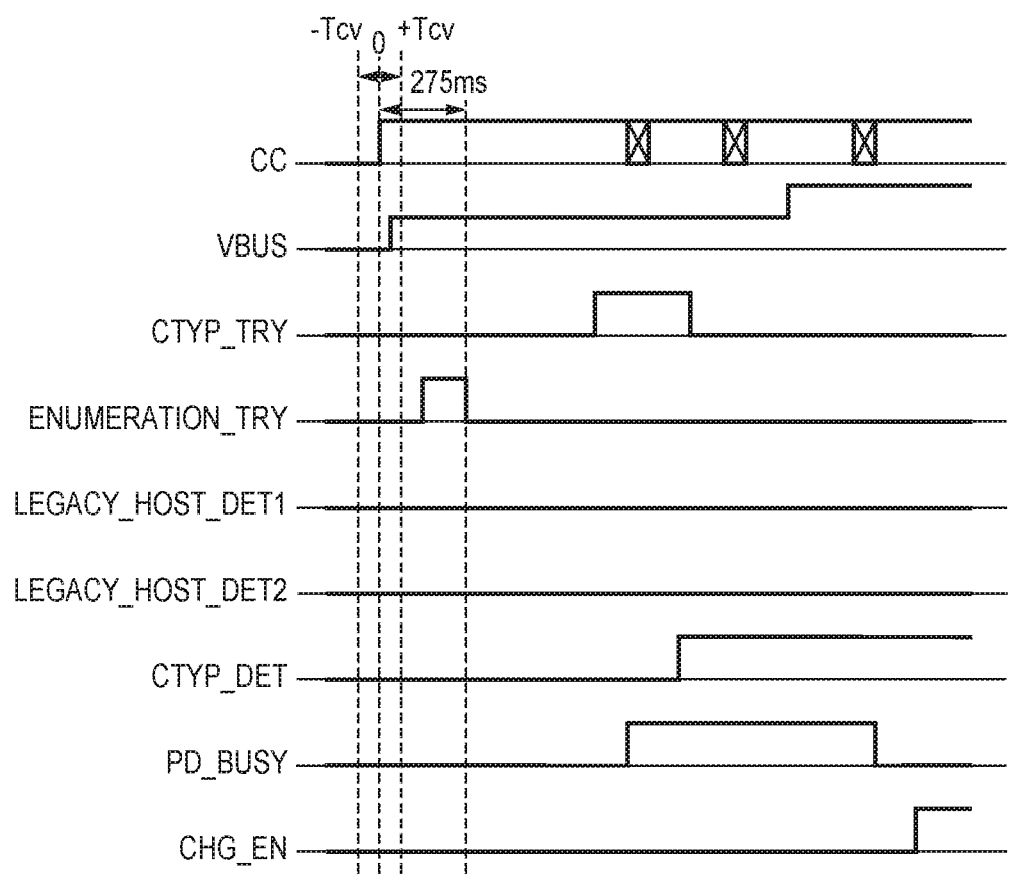

Similar to FIG. 4B, FIG. 4E is a timing chart showing a case where a power supply apparatus is a Type-C device, and the voltage of the VBUS terminal was detected within the time Tcv after the voltage of the CC terminal was detected. FIG. 4E further shows a case where USB PD communication between the electronic apparatus 301 and the power supply apparatus 401 using the CC terminal and change of a VBUS terminal voltage were performed.

The timing control block 335 outputs H to the ENUMERATION_TRY signal, and waits for a period until connected device detection processing and enumeration processing of the power supply apparatus 401 performed by the CPU 304 end (NO in step S110, and the procedure advances to steps S111 to S113). When the ENUMERATION_TRY signal changes to H, the CPU 304 performs connected device detection processing and enumeration processing of the power supply apparatus 401 (step S114). Since the power supply apparatus 401 is a Type-C device, the CPU 304 outputs L to the LEGACY_HOST_DET1 signal.

Since the LEGACY_HOST_DET1 signal is L, the timing control block 335 outputs H to the CTYP_TRY signal (NO in step S115, and the procedure advances to step S121). When the CTYP_TRY signal changes to H, the CHGIC 302 performs connected device detection of the power supply apparatus 401 connected to the electronic apparatus 301. Since the power supply apparatus 401 is a Type-C device, the CHGIC 302 outputs L to the LEGACY_HOST_DET2 signal. Subsequently, the CHGIC 302 performs USB PD communication using the CC terminal with the power supply apparatus 401 connected to the electronic apparatus 301. During USB PD communication, the PD_BUSY signal is H. Connected device detection and USB PD communication were correctly performed, and thus the CHGIC 302 outputs H to the CTYP_DET signal. The CHGIC 302 performs USB PD communication using the CC terminal with the power supply apparatus 401, and after the VBUS terminal voltage is changed, the CHGIC 302 further performs USB PD communication using the CC terminal with the power supply apparatus 401. When USB PD communication ends, the PD_BUSY signal changes to L. The CTYP_DET signal input is H, and the PD_BUSY signal input is L, and thus the timing control block 335 outputs H to the CHG_EN signal (NO in step S122, YES in step S123, YES in step S124, and the procedure advances to step S125).

As described above, according to the first embodiment, the electronic apparatus 301 that is a power reception apparatus determines whether or not the power supply apparatus 401 is a non-Type-C device, in the case where the voltage of the VBUS terminal was detected within the time Tcv after the voltage of the CC terminal was detected. Thus, even if a time when the voltage of the CC terminal was detected and a time when the voltage of the VBUS terminal was detected are deviated, the possibility of erroneous determination of the electronic apparatus 301 is reduced. Therefore, for example, it is not determined that a connection partner apparatus is unknown such that transition is made to a SUSPEND state, or an operation of receiving power that exceeds the standard of a non-Type-C device is not performed. If the power supply apparatus 401 is a Type-C device, not a non-Type-C device, the electronic apparatus 301 can perform a power reception operation that is based on the power supply capability of the Type-C standard. In addition, if the power supply apparatus 401 is a non-Type-C device, the electronic apparatus 301 can perform a power reception operation in accordance with the power supply capability of the non-Type-C standard.

Second Embodiment

In the first embodiment, description was given with an example in which operations of the timing detect block 303 are performed through hardware control. In a second embodiment, a case will be described in which some of the operations of the timing detect block 303 are performed through software control by a CPU other than the CPU 304.

FIG. 5 is a block diagram showing an exemplary configuration of an electronic apparatus 301 according to the second embodiment. In the block diagram used for description of the second embodiment, power source connection to blocks that are not required for description of the second embodiment is omitted. In addition, blocks and operations that are not required for the description of the second embodiment are omitted.

In FIG. 5, a timing detect block 303 is the timing detect block 303 described with reference to FIG. 3 in the first embodiment, a portion of which is replaced by a SUB-CPU 504. The SUB-CPU 504 is a CPU different from the CPU 304 and arranged in order to operate, as software control in a compatible manner, a portion of hardware control that is performed by the timing detect block 303.

The timing detect block 303 of the electronic apparatus 301 of the second embodiment and the timing detect block 303 of the electronic apparatus 301 of the first embodiment are configured to perform similar operations as viewed from the CPU 304 and CHGIC 302. Thus, the flowcharts in FIGS. 1A and 1B of the first embodiment can be applied as a flowchart in which the electronic apparatus 301 of the second embodiment starts operating under a power condition that is based on the power supply capability of the power supply apparatus 401. When the flowcharts in FIGS. 1A and 1B are applied, the truth table in FIG. 2 and the timing charts in FIGS. 4A to 4E are applied as an example of a signal control procedure and an example of an operation condition of the timing detect block 303 of the second embodiment.

According to the second embodiment, even if the timing detect block of an electronic apparatus is operated through software control in place of hardware control, the electronic apparatus can start operating under a power condition that is based on the power supply capability of a power supply apparatus.

Third Embodiment

In the first and second embodiments, connected device determination is performed based on timings of detection of the VBUS voltage and the CC terminal voltage of the USB interface, regardless of the battery voltage of an electronic apparatus. In a third embodiment, a method for performing connected device determination that is based on timings of detection of the VBUS voltage and the CC terminal voltage of the USB interface if the battery voltage of an electronic apparatus is larger than or equal to a predetermined voltage will be described.

In the third embodiment, a timing detect block 303 of an electronic apparatus 301 can be applied to both hardware control and software control. Therefore, in the third embodiment, a description will be given using operations of the electronic apparatus 301 described in the first embodiment, but operations of the electronic apparatus 301 of the second embodiment will be similar, if used.

In the third embodiment, there is a restriction that a CPU 304 of the electronic apparatus 301 cannot perform enumeration processing with a partner apparatus connected to the electronic apparatus 301 if the voltage of a battery pack 320 is not larger than or equal to a predetermined voltage. In addition, in the third embodiment, a configuration is provided in which a timing control block 335 of the timing detect block 303 detects a voltage of the battery pack 320. In addition, in the third embodiment, a CHGIC 302 restricts a current that is received from a power supply apparatus 401 to, for example, 100 mA or lower until the voltage of the battery pack 320 becomes larger than or equal to the predetermined voltage and connected device detection is started.

FIG. 6 is a flowchart showing a procedure in which the electronic apparatus 301 according to the third embodiment performs connected device determination that is based on timings at which the VBUS voltage and the CC terminal voltage of the USB interface were detected, and determines a power reception control condition for power from the power supply apparatus 401. In the flowchart in FIG. 6, the same reference numerals are given to the same processing as the first embodiment (FIG. 1A). Differences from the processing in FIG. 1A will be mainly described below.

As described in the first embodiment, if the absolute value of the time difference between the time Tc when the voltage of the CC terminal was detected and the time Tv when the voltage of the VBUS terminal was detected is smaller than or equal to the threshold value Tcv in step S110, enumeration is executed by the CPU 304. In the third embodiment, at this time, it is determined whether or not a voltage required for the CPU 304 to execute enumeration is supplied from the battery pack 320, and the battery pack 320 is charged as necessary (steps S511 to S514).

First, in step S511, the CHGIC 302 restricts a current that is received from the power supply apparatus 401 to 100 mA or lower. In step S512, the timing control block 335 outputs H to a CHG_EN signal, and causes the CHGIC 302 to charge a secondary battery cell 321. The CHG_EN signal is a signal for enabling a function of the CHGIC 302 charging the battery pack 320. In step S513, the timing control block 335 determines whether or not the voltage of the battery pack 320 is higher than or equal to a predetermined voltage Vt. Charging continues until it is determined in step S513 that the voltage of the battery pack 320 is higher than or equal to the predetermined voltage Vt (NO in step S513). In this manner, until a voltage that makes it possible for the CPU 304 to execute enumeration processing is started to be supplied from the battery pack 320, the value of a current that is received from the power supply apparatus 401 is restricted to a predetermined value (100 mA), and the battery pack 320 is charged.

If it is determined in step S513 that the voltage of the battery pack 320 is higher than or equal to the predetermined voltage Vt, the timing control block 335 outputs L to the CHG_EN signal in step S514, and stops charging of the secondary battery cell 321 that is performed by the CHGIC 302. Processing from step S111 onward is similar to the first embodiment.

As described above, according to the third embodiment, even in the case where the battery voltage of an electronic apparatus is lower than a predetermined voltage, and a CPU cannot perform enumeration processing of a partner apparatus, the battery can be charged without exceeding the power supply capability of a non-Type-C device. After that, at a stage where the battery voltage of the electronic apparatus 301 becomes high than or equal to the predetermined voltage, the CPU 304 can perform enumeration processing of the partner apparatus, and it becomes possible to perform connected device determination that is based on timings at which the VBUS voltage and the CC terminal voltage of the USB interface were detected.

As described above, according to the first to third embodiments, even if timings of detection of terminal voltages when an external apparatus is connected are deviated, the power supply capability of the external apparatus can be appropriately determined.

Note that, in the above first to third embodiments, the electronic apparatus 301 determines whether or not the absolute value of the difference between the time Tc when the voltage of the CC terminal was detected and the time Tv when the voltage of the VBUS terminal was detected is smaller than or equal to the threshold value Tcv, and the flowchart is branched. Here, 5 ms is used as the threshold value Tcv, which is not limited thereto, and it is needless to say that a time other than 5 ms may be applied as the threshold value Tcv.

Moreover, in the third embodiment, a description has been given with an example in which a CHGIC of an electronic apparatus restricts a current that is received from the power supply apparatus 401 to 100 mA or lower until the voltage of a battery pack becomes higher than or equal to a predetermined voltage, and connected device detection is started, but there is no limitation thereto. For example, a configuration may be adopted in which a current that is received from the power supply apparatus 401 is restricted to 500 mA or lower.

Fourth Embodiment

In the case where a VBUS voltage cannot be detected within 275 ms after a voltage of a CC terminal was detected, a power reception apparatus determines that a power supply apparatus is a non-Type-C device (a device that does not comply with the USB Type-C standard). Therefore, if a timing of VBUS voltage detection is delayed, even if the power supply apparatus is a Type-C device, the power reception apparatus recognizes that the power supply apparatus is a non-Type-C device. In that case, for example, the power reception apparatus sets power input to a SUSPEND state and performs an operation of prohibiting use of power from the power supply apparatus, restricts the power to the power of USB2.0, and the like. In view of this, there are demands for a method for detecting a device type for a power reception apparatus to correctly use the power supply capability of a power supply apparatus that is connected even if a timing when a terminal voltage is supplied is deviated.

In the fourth embodiment, the type of the external apparatus that is connected to an interface that includes a first terminal and a second terminal is determined, for example, according to a second voltage of the second terminal having been detected within a time limit after a first voltage of the first terminal was detected. More specifically, in the fourth embodiment, the electronic apparatus that detects whether or not the external apparatus connected to the USB interface is a Type-C device, based on timings of detection of a first voltage of the CC terminal as the first terminal and detection of a second voltage of the VBUS terminal as the second terminal is illustrated. The first and second voltages may be independent and different from each other. As in the above embodiments, "detecting a voltage of the VBUS terminal" and "detecting a VBUS (terminal) voltage" mean "detecting the first voltage at the VBUS terminal". Also, "detecting a voltage of the CC terminal" and "detecting a CC (terminal) voltage" mean "detecting the second voltage at CC terminal". The electronic apparatus performs connected device determination that is based on such timings at which the VBUS voltage and the CC terminal voltage of the USB interface were detected, and starts operating under a power condition that is based on the power supply capability of a power supply apparatus as the external apparatus.

Figure 9A:
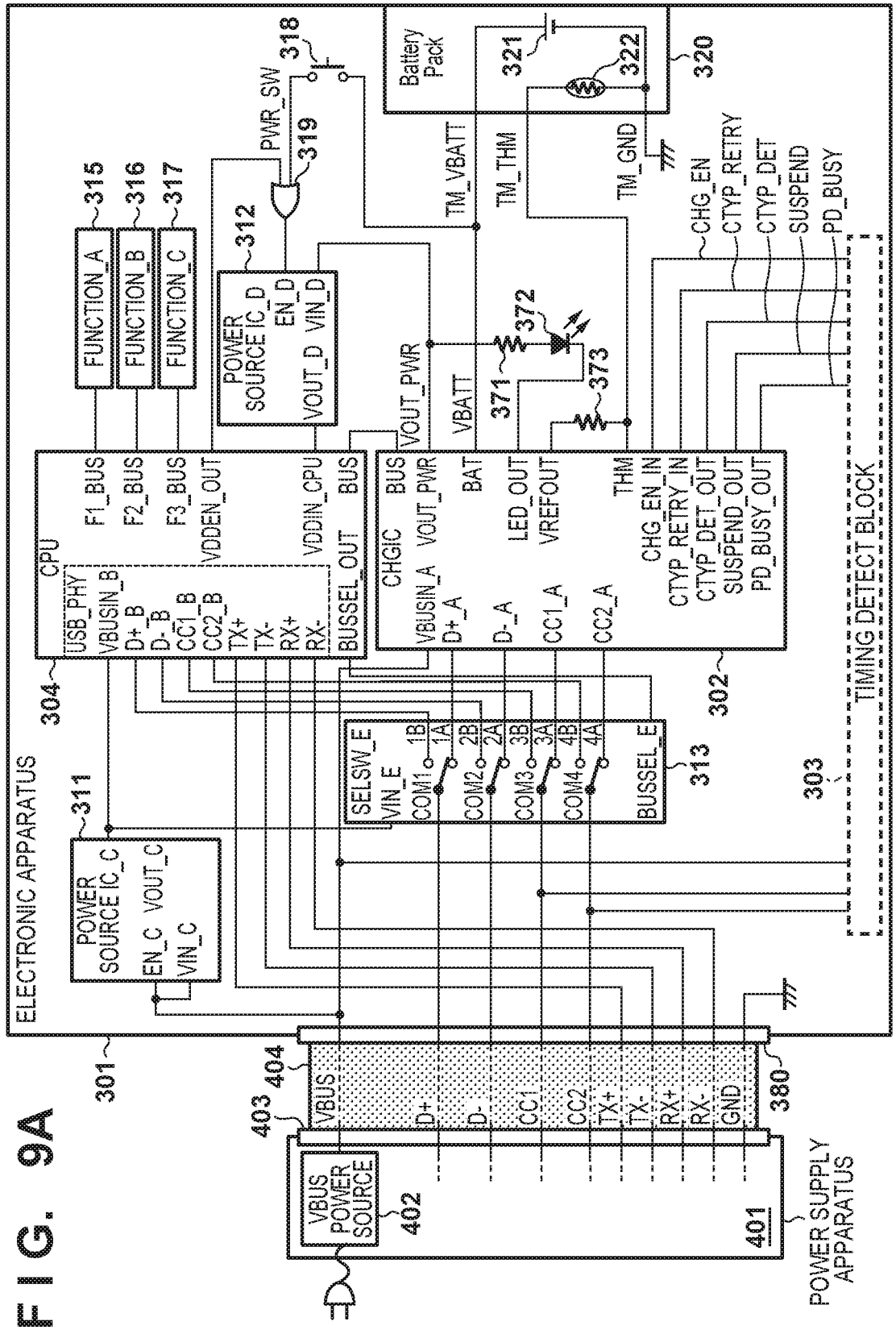
FIGS. 9A and 9B are block diagrams showing an exemplary configuration of the electronic apparatus in the fourth embodiment.
Figure 9B:
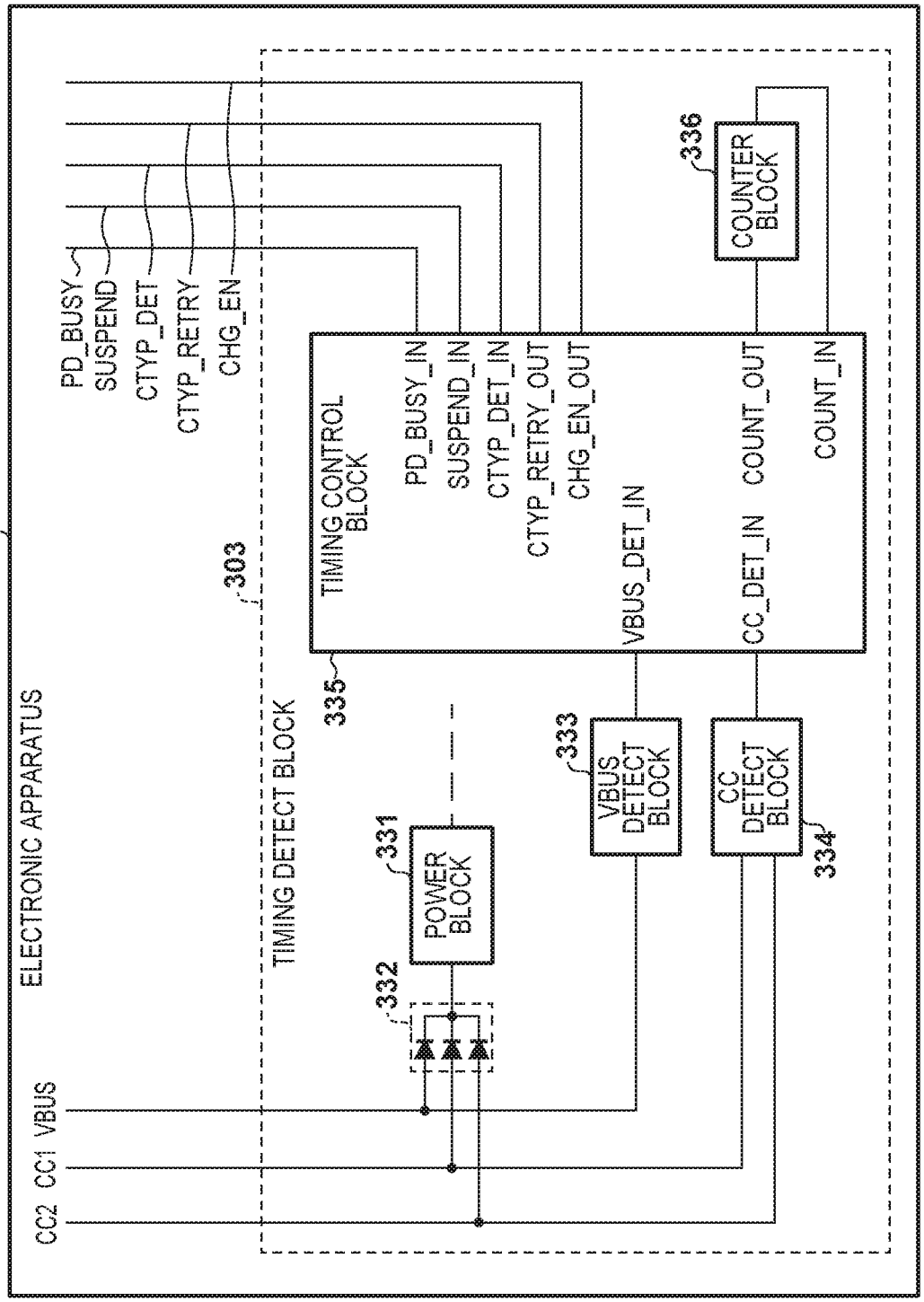

FIGS. 9A and 9B are block diagrams showing an exemplary configuration of the electronic apparatus according to the third embodiment. The same reference numerals are assigned to configurations similar to those of the first embodiment (FIGS. 3A and 3B). In addition, the same signal names are assigned to signals similar to those of the first embodiment. Differences from the configuration of the first embodiment will be mainly described below.

Unlike the first embodiment, a CPU 304 of the fourth embodiment does not have LEGACY_HOST_DET1_OUT or ENUMERATION_TRY_IN. In addition a CHGIC 302 does not have LEGACY_HOST_DET2 OUT or CTYP_TRY_IN. On the other hand a CHGIC 302 of the fourth embodiment has CTYP_RETRY_IN for receiving an input of a CTYP_RETRY signal that is an instruction to retry connected device detection. If the CTYP_RETRY signal is H, the CHGIC 302 executes a retry of connected device detection processing, and if the CTYP_RETRY signal is L, does not execute a retry of connected device detection processing. Signals and functions of CHG_EN_IN, CTYP_DET_OUT, SUSPEND_OUT, and PD_BUSY_OUT of the CHGIC 302 are as described in the first embodiment.

A PWR_SW signal that is an output of a button switch 318 and a VDDEN_OUT signal of the CPU 304 are OR-connected by OR 319. An electronic apparatus 301 can turn on a power source IC_D312 when one of the PWR_SW signal and the VDDEN_OUT signal of the CPU 304 is input.

A VBUS terminal, a CC1 terminal, and a CC2 terminal of a USB connector 380, and PD_BUSY, SUSPEND_OUT, CTYP_DET_OUT, CTYP_RETRY_IN, and CHG_EN_IN of the CHGIC 302 are connected to a timing detect block 303. FIG. 9B shows a detailed exemplary configuration of the timing detect block 303 according to the fourth embodiment. The timing detect block 303 is a circuit that detects the VBUS voltage and the CC terminal voltage of the USB interface, and performs control for extending a portion of a connected device detection function of the CHGIC 302 based on the detection timings.

A counter block 336 has a function for integrating or resetting the counter upon receiving signal output from COUNT_OUT of a timing control block 335, and a function for outputting the counter value to COUNT_IN of the timing control block 335.

The timing control block 335 performs control of extending a portion of the connected device detection function of the CHGIC 302 based on timings and combination of a CTYP_DET signal, a SUSPEND signal, an output of a VBUS detect block 333, an output of a CC detect block 334, and an output of a counter block 336. Control for extending a portion of the connected device detection function of the CHGIC 302 that is performed by the timing control block 335, a truth table and a control timing for controlling whether or not a battery pack 320 can be charged will be described later.

A CHG_EN signal that is input to CHG_EN_IN of the CHGIC 302 is output from CHG_EN_OUT of the timing control block 335. In addition, the CTYP_RETRY signal that is input to TYP_RETRY_IN of the CHGIC 302 is output from CTYP_RETRY_OUT of the timing control block 335. A PD_BUSY signal indicating that the CHGIC 302 is performing PD communication is input to PD_BUSY_IN of the timing control block 335. The timing control block 335 also performs exclusive control in which the CHG_EN signal is not set to H in the case where the CHGIC 302 is performing PD communication and the PD_BUSY signal is H.

Figure 7:
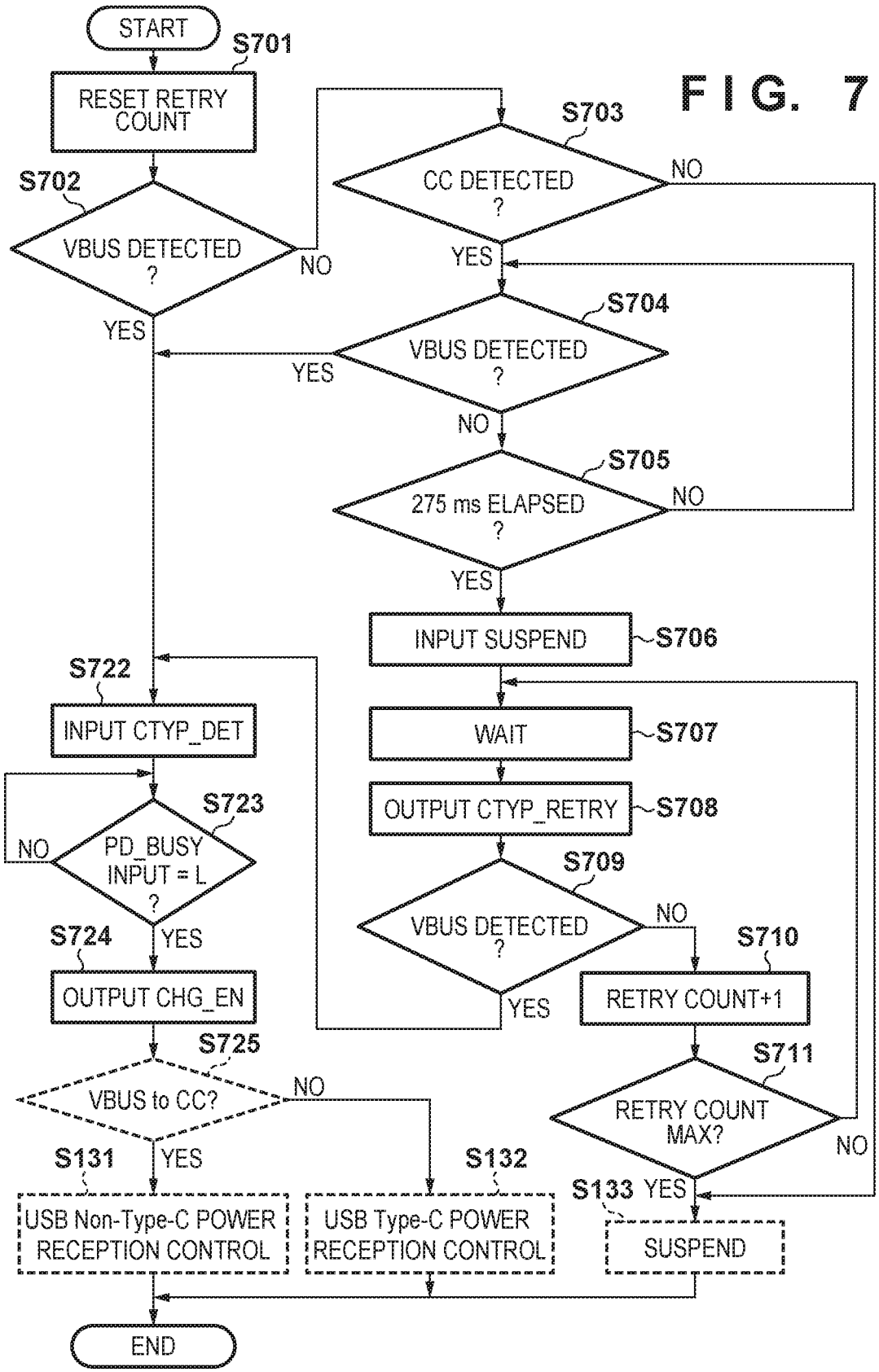
FIG. 7 is a flowchart showing a procedure in which an electronic apparatus in a fourth embodiment makes determination regarding a connected device.

The configuration of the electronic apparatus 301 of the fourth embodiment has been described above with reference to the block diagrams in FIGS. 9A and 9B. Next, operations in the fourth embodiment will be described with reference to the flowchart in FIG. 7. FIG. 7 is a flowchart showing a procedure in which the electronic apparatus 301 according to the fourth embodiment performs connected device determination that is based on timings at which the VBUS voltage and the CC terminal voltage of the USB interface were detected, and determines a condition for controlling power reception from the power supply apparatus 401. Processing shown in the flowchart in FIG. 7 is performed by the timing detect block 303. Note that, in the flowchart in FIG. 7, processing that is performed by a block other than the timing detect block 303 is illustrated by broken lines.

In step S701, when the power supply apparatus 401 is connected to a USB connector 380 of the electronic apparatus 301 via a USB interface cable 404, the timing detect block 303 starts operating, and resets the counter value of the counter block 336. In step S702, the timing detect block 303 determines whether or not a voltage of the VBUS terminal has been detected, based on a detection result signal of the VBUS terminal voltage from the VBUS detect block 333 that is input to VBUS_DET_IN. In other words, in step S702, the timing control block 335 determines whether or not the voltage at the VBUS terminal has reached a predetermined voltage (V1).

If it is determined in step S702 that the voltage of the VBUS terminal has been detected, the timing control block 335 receives the CTYP_DET signal from the CHGIC 302 in step S722. The CTYP_DET signal is a signal that is output in the case where the type of a partner apparatus connected to the electronic apparatus 301 could be determined by the connected device detection function of the CHGIC 302. Subsequently, in step S723, the timing control block 335 determines whether or not the PD_BUSY signal indicating that PD communication is being performed is L. While it is determined in step S723 that the PD_BUSY signal is not L, step S723 is repeated. Accordingly, the timing control block 335 waits until the PD_BUSY signal from the CHGIC 302 changes to L.

On the other hand, if it is determined in step S723 that the PD_BUSY signal is L, the timing control block 335 outputs the CHG_EN signal to the CHGIC 302 in step S724. The CHG_EN signal is a signal for enabling a function of the CHGIC 302 charging the battery pack 320. The CHGIC 302 determines in step S725 whether or not the CC terminal voltage has been detected after the VBUS terminal voltage was detected. If it is determined in step S725 that the CC terminal voltage has been detected after the VBUS terminal voltage was detected, the CHGIC 302 determines in step S131 that the power supply apparatus 401 does not comply with the USB Type-C standard. The CHGIC 302 then starts power reception control under a power reception condition that complies with the non-USB Type-C standard. The flowchart in FIG. 7 is then ended. On the other hand, if it is determined that the VBUS terminal voltage has been detected after the CC terminal voltage was received (NO in step S725), the CHGIC 302 determines that the power supply apparatus 401 complies with the USB Type-C standard in step S132. Power reception control is then started under a power reception condition that complies with the USB Type-C standard. Note that it is needless to say that the result of PD communication is taken into consideration in determination of a power reception condition that is adopted in steps S131 and S132. The flowchart in FIG. 7 is then ended.

Note that, similar to the first embodiment, a power reception control mode that starts in step S131 at power that complies with the non-USB Type-C standard is referred to as a non-USB Type-C power reception control mode, and a power reception control mode that starts in step S132 at power that complies with the USB Type-C standard is referred to as a USB Type-C power reception control mode.

If it is determined in step S702 that the voltage of the VBUS terminal has not been detected, the timing control block 335 determines in step S703 whether or not the CC detect block 334 has detected a voltage of the CC1 terminal or the CC2 terminal from the USB connector 380. In other words, in step S703, the timing control block 335 determines whether or not the voltage at the CC1 terminal and/or the CC2 terminal has reached a predetermined voltage (V2). A case where the timing control block 335 determines in step S703 that the voltage of the CC terminal has not been detected is a case where the power supply apparatus 401 does not comply with any USB standard. Therefore, the CHGIC 302 outputs H to the SUSPEND signal, and sets a SUSPEND state (step S133). In a SUSPEND state, a current from the power supply apparatus 401 is restricted to a current when the USB is suspended, namely 2.5 mA, or lower. In addition, charging of the secondary battery cell 321 of the battery pack 320 is prohibited. The timing control block 335 ends the processing of the flowchart in FIG. 7 in order to maintain this state without any change.

In the flowchart in FIG. 7, as the case where the procedure advances to step S133 after step S702 to S703, cases are conceivable such as where the VBUS terminal voltage is not sufficient, and the VBUS detect block 333 could not normally detect the voltage of the VBUS terminal, for example. Similar to the first embodiment, the SUSPEND state in step S133 is referred to as a SUSPEND mode. In addition, a connected device detection result that does not comply with any of the above-described USB standards is referred to as Other.

On the other hand, if it is determined in step S703 that the voltage of the CC terminal has been detected, the timing control block 335 determines in step S704 whether or not the VBUS detect block 333 has detected the voltage of the VBUS terminal from the USB connector 380. If it is determined in step S704 that the voltage of the VBUS terminal has been detected, the timing control block 335 executes processing from step S722 onward. The processing of steps from step S722 has been described above, and thus description thereof is omitted. The electronic apparatus 301 can determine whether or not the power supply apparatus 401 complies with one of the USB Type-C standard and the USB Type-C PD standard.

In the case where the voltage of the VBUS terminal was detected within the time limit of the standard (within 275 mS) after the voltage of the CC terminal was detected, the electronic apparatus 301 can determine that the power supply apparatus 401 that is connected is a Type-C device (a predetermined type). In view of this, if it is determined in step S704 that the voltage of the VBUS terminal was not detected, the timing control block 335 determines in step S705 whether or not 275 ms, the time limit of the standard, has elapsed after the voltage of the CC terminal was detected. If it is determined that 275 ms has not elapsed after the voltage of the CC terminal was detected, the processing of step S704 is repeated. If it is determined that 275 ms has elapsed without the voltage of the VBUS terminal being detected after the voltage of the CC terminal was detected, the timing control block 335 receives the SUSPEND signal from the CHGIC 302 in step S706. In this case, since the voltage of the VBUS terminal was not detected within 275 ms after the voltage of the CC terminal was detected, the CHGIC 302 determines that a standard with which the power supply apparatus 401 complies is unknown, and if the timing detect block 303 does not perform any control, a SUSPEND state is entered in this state.

In step S707, the timing control block 335 waits for a certain amount of time, for example, a Twait time, and then the procedure advances to step S708. Here, Twait is set to any time, but, in this embodiment, is set to 100 ms, for example. In step S708, the timing control block 335 outputs a CTYP_RETRY signal to the CHGIC 302. The CTYP_RETRY signal is a signal for causing the connected device detection function of the CHGIC 302 to retry determination of a type of an external apparatus connected to the electronic apparatus 301. In step S709, the timing control block 335 determines whether or not the VBUS detect block 333 has detected the voltage of the VBUS terminal from the USB connector 380. In other words, in step S709, the timing control block 335 determines whether or not the voltage at the VBUS terminal has reached a predetermined voltage (V1). If it is determined in step S709 that the voltage of the VBUS terminal has been detected, the timing control block 335 executes processing from step S722 onward. The processing from step S722 onward has been described above, and thus a description thereof is omitted. In this manner, in the case where the voltage of the VBUS terminal cannot be detected within a time limit after the voltage of the CC terminal was detected, determination of the type of the external apparatus is retried after a predetermined time has elapsed. In addition, the CHGIC 302 cancels the SUSPEND state and retries detection of a VBUS voltage according to a retry instruction from the timing control block 335. Note that a configuration may be adopted in which the CHGIC 302 executes retry of detection of a VBUS voltage according to a retry instruction from the timing control block 335, and in the case where a VBUS voltage could be detected, cancels the SUSPEND state.

If it is determined in step S709 that the voltage of the VBUS terminal has not been detected, the timing control block 335 adds 1 to the number of counts of the counter block 336 in step S710. The number of counts of the counter block 336 was reset to 0 in step S701, and thus the number of counts of the counter block 336 indicates the number of retries. Specifically, the number of counts of the counter block 336 corresponds to the number of times that determination of a type of a partner apparatus connected to the electronic apparatus 301 was retried by the connected device detection function of the CHGIC 302.

In step S711, the timing control block 335 determines whether or not the number of counts counted by the counter block 336 has reached a prescribed maximum number of counts. Here, the prescribed maximum number of counts corresponds to the maximum number of times that determination of a type of a partner apparatus connected to the electronic apparatus 301 has been retried by the connected device detection function of the CHGIC 302. The prescribed maximum number of counts is any number of times, but, in this embodiment, is set to three, for example. If it is determined in step S711 that the number of counts of the counter block 336 has not reached the prescribed maximum number of counts, the timing control block 335 executes the processing from step S707 onward. If it is determined in step S711 that the number of counts of the counter block 336 has reached the prescribed maximum number of counts, the timing control block 335 ends the procedure, and the CHGIC 302 maintains the suspend state (step S133). In this manner, while the voltage of the VBUS terminal has not been detected although the voltage of the CC terminal was detected, retry of determination of a type is repeated using the predetermined number of times (in this embodiment, three) as an upper limit.

According to the flowchart in FIG. 7, for example, in the case where the voltage of the VBUS terminal could be not detected within 275 ms after the voltage of the CC terminal was detected, determination of a type of a partner apparatus connected to the electronic apparatus 301 is retried in step S708. In addition, the above-described retry is performed a predetermined number of times by performing addition of the number of counts in step S710 and determination of the maximum number of counts in step S711, and in the case where the voltage of the VBUS terminal could be detected by performing retry, the electronic apparatus 301 can start power reception control at power that complies with the USB Type-C standard.

FIG. 8 shows a truth table of a result of connected device detection performed by the electronic apparatus 301 (connected device type) in the case of operating in accordance with the flowchart in FIG. 7, a result of timings of detection of a VBUS voltage and a CC voltage, a power reception control mode, and voltage and current conditions. In the truth table in FIG. 8, the connected device type being non-Type-C corresponds to a timing detection result in the case where the CC terminal voltage was detected after the VBUS terminal voltage was detected. Since the power supply apparatus 401 comprises with one of USB2.0, USB3.0, USB3.1, and USB BC standards in the case where the connected device type is non-Type-C, and thus a non-Type-C power reception control mode suitable for one of the standard is set. Voltage and current conditions are 5V and 1.5 A or lower.

In addition, in the truth table in FIG. 8, a connected device type being Type-C corresponds to a timing detection result in the case where the VBUS terminal voltage was detected within 275 mS after the CC terminal voltage was detected, or in the case where the VBUS terminal voltage was detected by performing the above-described retry. Since the power supply apparatus 401 complies with the Type-C standard in the case where a connected device type is Type-C, a Type-C power reception control mode suitable for the Type-C standard is set. Voltage and current conditions are 20V or lower and 5 A or lower.

In the truth table in FIG. 8, a connected device type being Other corresponds to a timing detection result in the case where both the CC terminal voltage and the VBUS terminal voltage were not detected, or the case where the number of counts of the above-described retry has reached the prescribed maximum number of counts. Since the power supply apparatus 401 does not comply with any USB standard in the case where the connected device type is Other, a SUSPEND mode is set. Voltage and current conditions are 5V and 2.5 mA or lower.

Figure 10A:
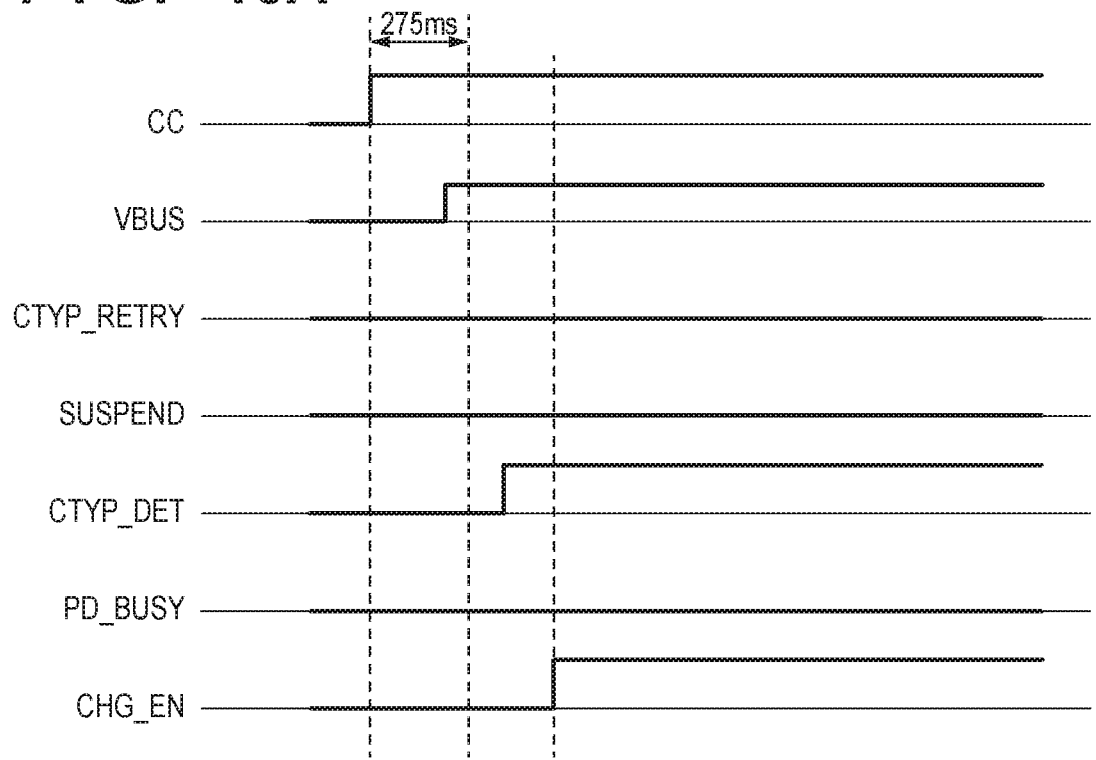
FIGS. 10A to 10D are timing charts showing a signal control procedure of the electronic apparatus in the fourth embodiment.
Figure 10B:
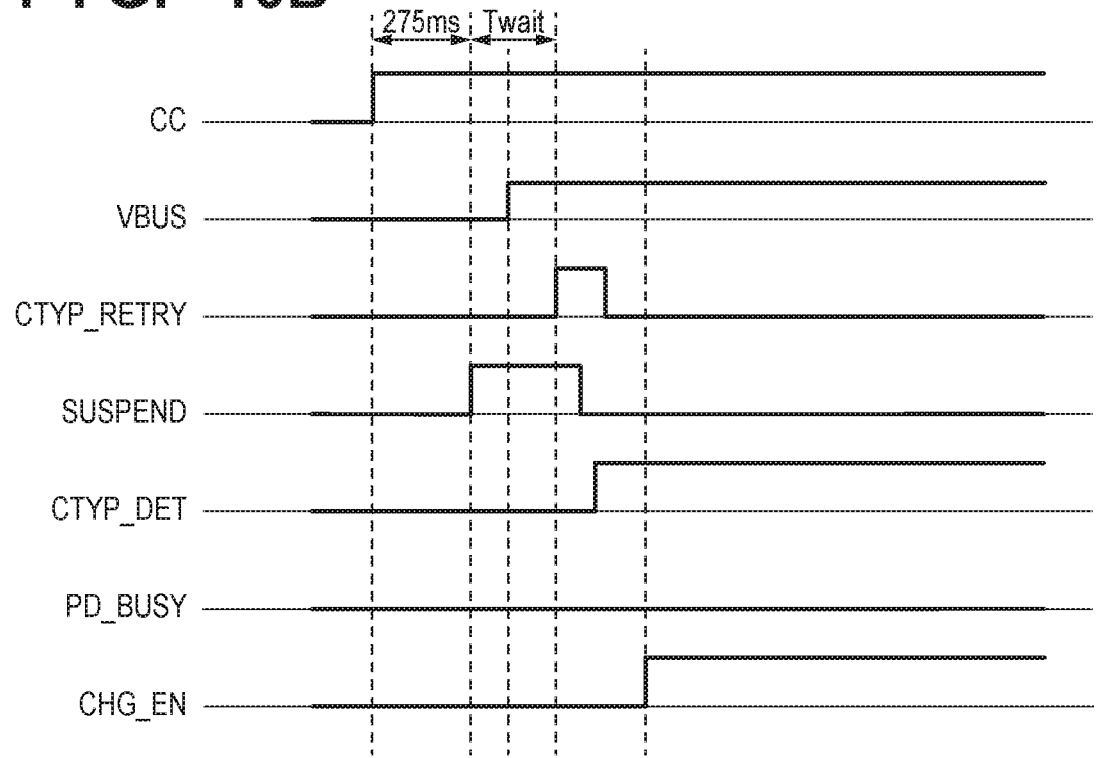

FIGS. 10A and 10B are timing charts showing an example of a signal control procedure for performing control so as to extend a portion of the connected device detection function of the CHGIC 302 using the timing detect block 303 of the electronic apparatus 301 according to the first embodiment.

FIG. 10A is a timing chart showing a case where the VBUS terminal voltage was detected within 275 ms after the CC terminal voltage was detected in the flowchart in FIG. 7. The VBUS terminal voltage is detected within 275 ms after the CC terminal voltage was detected, and the CHGIC 302 outputs a CTYP_DET signal. If the PD_BUSY signal input is L, the timing detect block 303 outputs the CHG_EN signal.

FIG. 10B is a timing chart showing a case where the VBUS terminal voltage was not detected within 275 ms after the CC terminal voltage was detected in the flowchart in FIG. 7, and the VBUS terminal voltage was detected by retrying determination of a type of a partner apparatus connected to the electronic apparatus 301. The VBUS terminal voltage has not been detected within 275 ms after the CC terminal voltage was detected, and the CHGIC 302 sets a SUSPEND state. After 275 ms elapsed after the CC terminal voltage was detected, and the Twait time further elapsed, the timing detect block 303 outputs a CTYP_RETRY signal. The CHGIC 302 cancels the SUSPEND state, and retries determination a type of a partner apparatus connected to the electronic apparatus 301. In FIG. 4B, the VBUS terminal voltage from the power supply apparatus 401 is supplied after the CC terminal voltage was detected. The CHGIC 302 outputs the CTYP_DET signal such that connected device detection can be correctly performed. When the CTYP_DET signal is input, the timing detect block 303 stops the output of the CTYP_RETRY signal. In addition, if the PD_BUSY signal input is L, the timing detect block 303 outputs the CHG_EN signal.

Figure 10C:
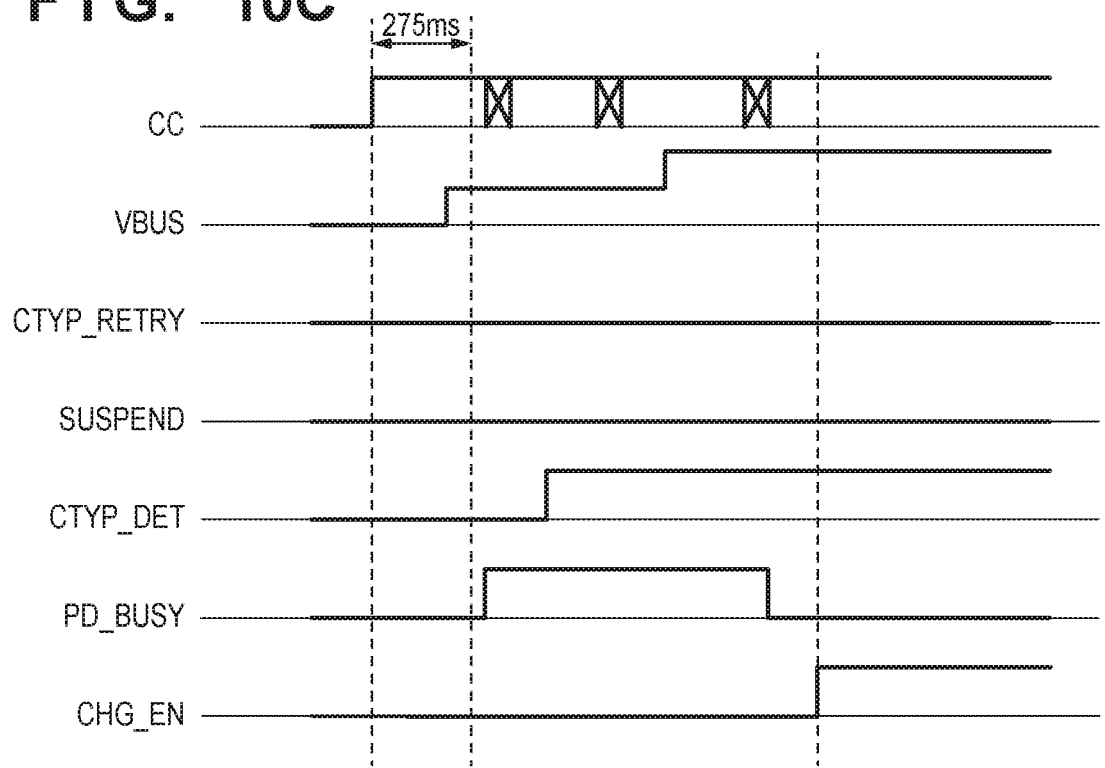
Figure 10D:
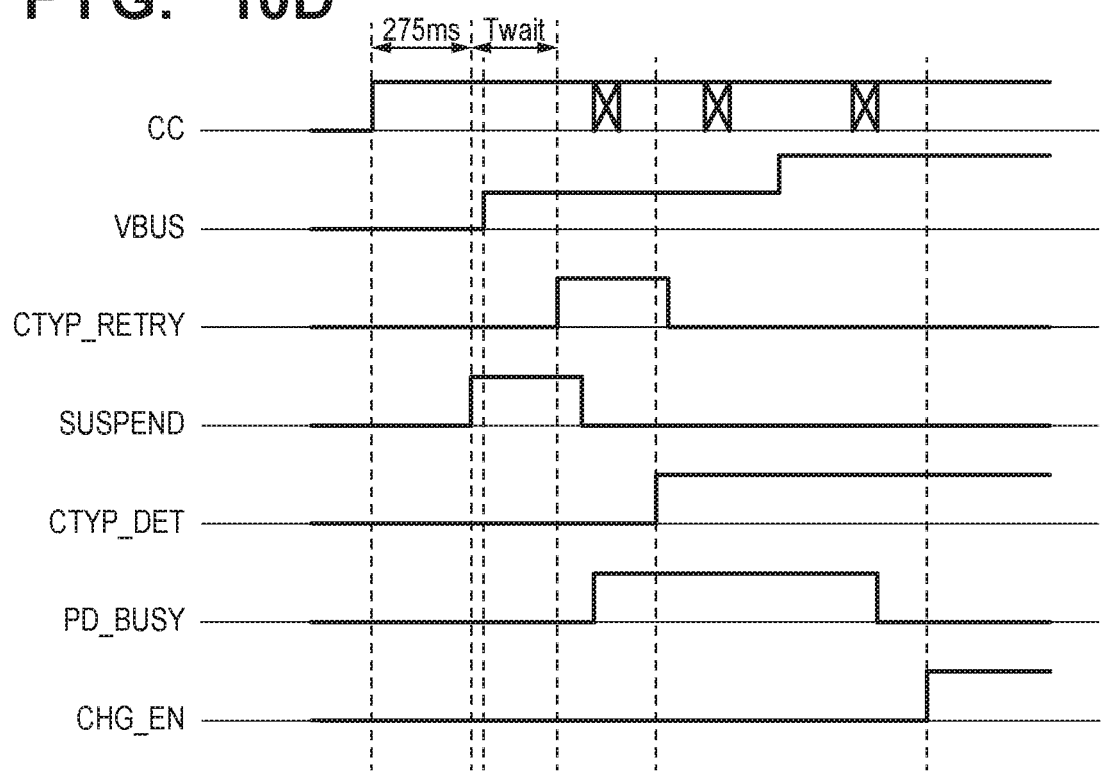

FIG. 10C is a timing chart showing a case in which the VBUS terminal voltage was detected within 275 ms after the CC terminal voltage was detected in the flowchart in FIG. 7, and after that, USB PD communication using the CC terminal is performed and the VBUS terminal voltage is changed. The VBUS terminal voltage is detected within 275 ms after the CC terminal voltage was detected, and the CHGIC 302 performs USB PD communication using the CC terminal with the power supply apparatus 401, and outputs the CTYP_DET signal. At this time, PD communication of the USB is being executed, and thus the PD_BUSY signal is H. The CHGIC 302 repeats USB PD communication using the CC terminal with the power supply apparatus 401 and change of the VBUS terminal voltage that is based on the result. When PD communication ends, and the PD_BUSY signal input changes to L, the timing detect block 303 outputs the CHG_EN signal.

FIG. 10B is a timing chart showing a case where the VBUS terminal voltage was not detected within 275 ms after the CC terminal voltage was detected in the flowchart in FIG. 7, but the VBUS terminal voltage was supplied during the subsequent retry. Furthermore, FIG. 4D is a timing chart showing a case where the electronic apparatus 301 detected the VBUS terminal voltage by performing retry, and the VBUS terminal voltage was changed in PD communication using the CC terminal. The VBUS terminal voltage was not detected within 275 ms after the CC terminal voltage was detected, and the CHGIC 302 enters a SUSPEND state. After 275 ms after the CC terminal voltage was detected, and the Twait time further has elapsed, the timing detect block 303 outputs the CTYP_RETRY signal.

The CHGIC 302 cancels the SUSPEND state according to the CTYP_RETRY signal, and retries determination of a type of a partner apparatus connected to the electronic apparatus 301. When connected device detection and PD communication were correctly performed by performing retry, the CHGIC 302 outputs the CTYP_DET signal. During PD communication, the PD_BUSY signal is H. When the CTYP_DET signal is input, the timing detect block 303 stops the output of the CTYP_RETRY signal. The CHGIC 302 repeats PD communication using the CC terminal with the power supply apparatus 401 and change of the VBUS terminal voltage that is based on the result. When PD communication ends, and the PD_BUSY signal input changes to L, the timing detect block 303 outputs the CHG_EN signal.

As described above, according to the first embodiment, even in the case where the VBUS voltage cannot be detected within 275 ms after the CC terminal voltage was detected, the UFP apparatus is not fixed to the SUSPEND state when the above-described condition occurs only once. Therefore, according to the first embodiment, in a case where a detection timing of the VBUS voltage of the UFP apparatus is delayed due to delay in a VBUS voltage output timing of the DFP apparatus and VBUS output and input capacitances, it is possible to enable the UFP apparatus to recover from the SUSPEND state.

Fifth Embodiment

In the fourth embodiment, description has been given with an example in which operations of the timing detect block 303 are performed through hardware control, but the present invention is not limited thereto. Some operations of the timing detect block 303 may be performed through software control that is performed by a CPU other than the CPU 304. For example, as shown in FIG. 11, the timing control block 335 and the counter block 336 that are a portion of the timing detect block 303 may be replaced by a SUB-CPU 504. The SUB-CPU 504 is a CPU other than the CPU 304 arranged in order to operate, as software control in a compatible manner, a portion of hardware control that is performed by the timing detect block 303.

The timing detect block 303 of the electronic apparatus 301 according to the fifth embodiment and the timing detect block 303 of the electronic apparatus 301 of the fourth embodiment have configurations for performing similar operations when viewed from the CPU 304 and the CHGIC 302. Thus, examples of processing, an operation condition, and a control procedure for the electronic apparatus 301 according to the second embodiment to start an operation under a power condition that is based on the power supply capability of the power supply apparatus 401 are as described in the fourth embodiment (FIGS. 7, 8, 9A, 9B, and 10A to 10D).

According to the fifth embodiment, even if the timing detect block 303 of the electronic apparatus 301 is based on software control, not hardware control, it is possible to start an operation under a power condition that is based on the power supply capability of a power supply apparatus. According to the fifth embodiment, in the case where a timing of detection of the VBUS voltage that is performed by an electronic apparatus as the UFP apparatus is delayed due to delay of a VBUS voltage output timing of the DFP apparatus and VBUS output and input capacitances, the electronic apparatus can be recovered from the SUSPEND state.

As described above, according to the fourth and fifth embodiments, in the case where a type of an external apparatus is determined based on a timing of application of a voltage to a terminal, even if a detection timing varies, it is possible to appropriately determine the power supply capability of the external apparatus.

Note that, in the above fourth and fifth embodiments, the electronic apparatus 301 determines whether or not VBUS is supplied within 275 ms after the CC terminal voltage was detected, and the flowchart is branched, but the present invention is not limited thereto. For example, a time limit other than 275 ms may be applied.

OTHER EMBODIMENTS

In the first to fifth embodiments, description has been given with an example in which an electronic apparatus charges a battery pack with power received from a power supply apparatus, but the present invention is not limited thereto. For example, a configuration may be adopted in which the battery pack 320 is not charged with power received by the electronic apparatus 301 from the power supply apparatus 401, and the power that has been received is used as power for operating an image capturing function unit, an external apparatus storage function unit, and a display function unit of the electronic apparatus 301.

In the first to fifth embodiments, description has been given with an example in which signal transmission between the CHGIC and the timing detect block is performed using parallel signals, but the present invention is not limited thereto. For example, a configuration may be adopted in which signal transmission between the CHGIC 302 and the timing detect block 303 is performed using serial signals. In that case, a general-purpose serial communication standard such as 2 lines and 3 lines is preferably used as serial signals.

In addition, in the first to fifth embodiments, description has been given with an example in which the CHGIC 302 and the timing detect block 303 are configured separately, but the present invention is not limited thereto. For example, a configuration may be adopted in which the CHGIC 302 includes the functions of the timing detect block 303, and is configured integrally. In that case, signals used between the CHGIC 302 and the timing detect block 303 that are separated from each other may be logically combined and used as signals inside the CHGIC that is configured integrally.

In addition, in the first and fourth embodiments, description has been given with an example in which a portion of the timing detect block 303 is constituted by the timing control block 335, and in the second and fifth embodiments, description has been given with an example in which a portion of the timing detect block 303 is constituted by the SUB-CPU 504. However, the present invention is not limited thereto. For example, the timing detect block 303 may be achieved by using a reconfigurable IC such as a PLD (Programmable Logic Device). Also, the timing detect block 303 may be achieved by using an IC such as an ASIC (Application Specific Integrated Circuit).

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™) a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-107064, filed May 30, 2017 and Japanese Patent Application No. 2017-107065, filed May 30, 2017, which are hereby incorporated by reference herein in their entirety.

What is claimed is:

1. An electronic apparatus that can receive power from an external apparatus connected via an interface, comprising:
an interface having a first terminal and a second terminal:
a determination unit configured to determine whether or not a time difference between a time of detection of a first voltage at a first terminal and a time of detection of a second voltage at a second terminal is smaller than or equal to a predetermined value;
an execution unit configured to determine a type of the external apparatus by executing first connected device detection in a case where the time difference is smaller than or equal to the predetermined value, and executing second connected device detection different from the first connected device detection in a case where the time difference is larger than the predetermined value; and
a control unit configured to perform power reception control based on a result of determination of a type of the external apparatus performed by the execution unit.

2. The electronic apparatus according to claim 1,
wherein the execution unit executes the second connected device detection in a case where a type of the external apparatus is not determined by the first connected device detection.

3. The electronic apparatus according to claim 1,
wherein the second connected device detection includes detection that uses an order of a timing of detection of the first voltage at the first terminal and a timing of detection of the second voltage at the second terminal.

4. The electronic apparatus according claim 1,
wherein the interface is a USB, the first terminal is a VBUS terminal, and the second terminal is a CC terminal.

5. The electronic apparatus according to claim 4,
wherein, in the first connected device detection, enumeration processing with the external apparatus is executed, and
the control unit performs control so as to receive power from the external apparatus at power that is based on a result of the enumeration processing.

6. The electronic apparatus according to claim 5,
wherein, in a case where the enumeration processing has ended normally, the control unit restricts a current that is received from the external apparatus to a current value declared in a configuration descriptor in the enumeration processing, or lower.

7. The electronic apparatus according to claim 4,
wherein, in a case where the first voltage was detected at the VBUS terminal after the second voltage was detected at the CC terminal, it is determined in the second connected device detection that the external apparatus is a Type-C device.

8. The electronic apparatus according to claim 4,
wherein, in a case where a type of the external apparatus could not be determined through the first connected device detection and the second connected device detection, the control unit sets power reception from the external apparatus to a suspend state.

9. The electronic apparatus according to claim 8,
wherein, in the suspend state, a current that is received from the external apparatus is restricted to 2.5 mA that is a suspend current, or lower.

10. The electronic apparatus according to claim 1,
wherein, until it becomes possible to execute the first connected device detection, a value of a current that is received from the external apparatus is restricted to a predetermined value, and a battery is charged.

11. The electronic apparatus according to claim 10,
wherein the predetermined value is 100 mA or 500 mA.

12. A control method of an electronic apparatus that can receive power from an external apparatus connected via an interface including a first terminal and a second terminal, the method comprising:
determining whether or not a time difference between a time of detection a first voltages at the first terminal and a time of detection of a second voltage at the second terminal is smaller than or equal to a predetermined value;
determining a type of the external apparatus by executing first connected device detection in a case where the time difference is smaller than or equal to the predetermined value, and executing second connected device detection different from the first connected device detection in a case where the time difference is larger than the predetermined value; and
performing power reception control based on a result of determination of a type of the external apparatus.

13. A non-transitory computer-readable storage medium that stores a program for causing a computer to execute a control method of an electronic apparatus that can receive power from an external apparatus connected via an interface, the control method comprising:
determining whether or not a time difference between a time of detection a first voltages at the first terminal and a time of detection of a second voltage at the second terminal is smaller than or equal to a predetermined value;
determining a type of the external apparatus by executing first connected device detection in a case where the time difference is smaller than or equal to the predetermined value, and executing second connected device detection different from the first connected device detection in a case where the time difference is larger than the predetermined value; and
performing power reception control based on a result of determination of a type of the external apparatus.

* * * * *